(12) United States Patent
Osawa et al.

(10) Patent No.: US 9,979,364 B2
(45) Date of Patent: May 22, 2018

(54) SEMICONDUCTOR DEVICE WITH IMPROVED VARIABLE GAIN AMPLIFICATION

(71) Applicant: OLYMPUS CORPORATION, Tokyo (JP)

(72) Inventors: Masato Osawa, Tokyo (JP); Yasunari Harada, Ebina (JP); Hideki Kato, Tokyo (JP)

(73) Assignee: OLYMPUS CORPORATION, Tokyo (JP)

(*) Notice: Subject to any disclaimer, the term of this patent is extended or adjusted under 35 U.S.C. 154(b) by 0 days. days.

(21) Appl. No.: 15/788,505

(22) Filed: Oct. 19, 2017

(65) Prior Publication Data
US 2018/0062595 A1   Mar. 1, 2018

Related U.S. Application Data

(63) Continuation of application No. PCT/JP2015/062263, filed on Apr. 22, 2015.

(51) Int. Cl.
*H03M 1/00* (2006.01)
*H03F 3/72* (2006.01)
(Continued)

(52) U.S. Cl.
CPC ............. *H03F 3/72* (2013.01); *H03F 1/26* (2013.01); *H03F 3/45475* (2013.01);
(Continued)

(58) Field of Classification Search
CPC .......... H03F 3/72; H03F 3/26; H03F 3/45475; H03F 1/26; H03G 1/0094; H03M 1/1245
(Continued)

(56) References Cited

U.S. PATENT DOCUMENTS 5,471,654 A * 11/1995 Okazaki ............... H03G 1/04
330/256
8,891,697 B2 * 11/2014 Kobayashi ............ H03F 3/189
375/345

(Continued)

FOREIGN PATENT DOCUMENTS

| JP | 10-32441 A | 2/1998 |
| JP | 2012-191436 A | 10/2012 |
| JP | 2013-17130 A | 1/2013 |

OTHER PUBLICATIONS

International Search Report dated Jun. 2, 2015, issued in counterpart International Application No. PCT/JP2015/062263 (1 page).
(Continued)

*Primary Examiner* — Lam T Mai
(74) *Attorney, Agent, or Firm* — Westerman, Hattori, Daniels & Adrian, LLP

(57) ABSTRACT

In a semiconductor device, a first variable gain amplifier and a second variable gain amplifier constitute a switched capacitor type variable gain amplifier. A selection switch switches connection among the first variable gain amplifier, the second variable gain amplifier, and a load circuit such that the first variable gain amplifier and the load circuit are connected to each other when an amplification factor of the first variable gain amplifier is a predetermined gain or less, and the second variable gain amplifier is connected between the first variable gain amplifier and the load circuit when the amplification factor of the first variable gain amplifier is larger than the predetermined gain.

9 Claims, 18 Drawing Sheets

(51) Int. Cl.
H03G 1/00 (2006.01)
H03F 1/26 (2006.01)
H03F 3/45 (2006.01)
H03M 1/12 (2006.01)

(52) U.S. Cl.
CPC ........ *H03G 1/0094* (2013.01); *H03M 1/1245* (2013.01); *H03F 2200/135* (2013.01); *H03F 2200/213* (2013.01); *H03F 2200/411* (2013.01); *H03F 2200/45* (2013.01); *H03F 2203/7231* (2013.01)

(58) Field of Classification Search
USPC .................................................. 341/118, 122
See application file for complete search history.

(56) References Cited

U.S. PATENT DOCUMENTS

2013/0136213 A1 5/2013 Kobayashi et al.
2014/0203958 A1* 7/2014 Okuda .................. H03M 1/124
341/172

OTHER PUBLICATIONS

Razavi, "Design of Analog CMOS Integrated Circuits: Application", Maruzen, Mar. 2003 (8 pages).
Taniguchi, Introduction to CMOS Analog Circuits, CQ Publishing Co., Ltd. 2005 (10 pages).

* cited by examiner

FIG. 2

| G | G1 | G2 | S1 | S2 |
|---|---|---|---|---|
| 0.5 | $-\sqrt{0.5}$ | $-\sqrt{0.5}$ | T1 | T1 |
| 1 | $-1$ | $-1$ | T1 | T1 |
| 2 | $-\sqrt{2}$ | $-\sqrt{2}$ | T2 | T2 |
| 4 | $-2$ | $-2$ | T2 | T2 |
| 8 | $-2\sqrt{2}$ | $-2\sqrt{2}$ | T2 | T2 |

$RTI_{NOISE} = Vn1^2 [V^2]$ $RTI_{NOISE} = Vn1^2 + (Vn2/G1)^2 [V^2]$

FIG. 18

| | | | VARIABLE GAIN AMPLIFIER IN FOURTH EMBODIMENT | | | | | | | | VARIABLE AMPLIFIER IN THE RELATED ART | | | |
|---|---|---|---|---|---|---|---|---|---|---|---|---|---|---|
| G | G1 | G2 | Cs1 | Cf1 | Cs2 | Cf2 | CL | $C_{Leff1}$ | $C_{Leff2}$ | $C_{Leff}$ | $G_{PA}$ | Cs | Cf | $C_{Leff\_PA}$ |
| 1 | 1 | – | 0.275 | 0.275 | – | – | 0.5 | 1.275 | 0.000 | 1.275 | 1 | 0.275 | 0.275 | 1.275 |
| 2 | 2 | 1 | 0.275 | 0.138 | 0.138 | 0.138 | 0.5 | 0.688 | 1.138 | 1.825 | 2 | 0.275 | 0.138 | 1.775 |
| 4 | 4 | 1 | 0.275 | 0.069 | 0.069 | 0.069 | 0.5 | 0.619 | 1.069 | 1.688 | 4 | 0.275 | 0.069 | 2.775 |
| 8 | 8 | 1 | 0.275 | 0.034 | 0.034 | 0.034 | 0.5 | 0.584 | 1.034 | 1.619 | 8 | 0.275 | 0.034 | 4.775 |

SEMICONDUCTOR DEVICE WITH IMPROVED VARIABLE GAIN AMPLIFICATION

The present application is a continuation application based on International Patent Application No. PCT/JP2015/062263, filed Apr. 22, 2015, the content of which is incorporated herein by reference.

BACKGROUND OF THE INVENTION

Field of the Invention

The present invention relates to a semiconductor device.

Description of Related Art

Methods of cascade-connecting two amplifiers to amplify an input signal with a high gain at a high speed are generally known. FIGS. 19 and 20 show connections of amplifiers, waveforms of input signals Vin of the amplifiers, and waveforms of output signals Vout of the amplifiers. FIG. 19 shows an example of the amplifier of only one stage. FIG. 20 shows an example in which a two-stage amplifier is cascade-connected.

As described in following Non-Patent Literature 1, when a single pole amplifier alone having an open gain of 100 and a band of 10 MHz amplifies a rectangular wave of 20 MHz, a waveform thereof greatly deteriorates (FIG. 19). It is possible that a closed loop gain becomes 10 and a band becomes 100 MHz when feedback is applied to such an amplifier. It is possible to perform amplification in which deterioration of the rectangular wave is suppressed by connecting two amplifiers having such characteristics in series (FIG. 20).

Non-Patent Literature 1: "Design of Analog CMOS Integrated Circuits: Applications" written by Behzad Razavi, Maruzen, March 2003

SUMMARY OF THE INVENTION

According to a first aspect of the present invention, a semiconductor device includes a first variable gain amplifier, a second variable gain amplifier, a load circuit including a capacitive load, and a selection switch. The first variable gain amplifier includes a first sampling capacitance configured to hold a first voltage signal which is input, a first feedback capacitance, and a first operational amplifier. The first operational amplifier includes a first input terminal and a first output terminal. The first input terminal is connected to the first sampling capacitance. The first feedback capacitance is connected between the first input terminal and the first output terminal. An amplification factor of the first variable gain amplifier is determined by a ratio between a capacitance value of the first sampling capacitance and a capacitance value of the first feedback capacitance. The second variable gain amplifier includes a second sampling capacitance configured to sample a second voltage signal which is output from the first variable gain amplifier, a second feedback capacitance, and a second operational amplifier. The second operational amplifier includes a second input terminal and a second output terminal. The second input terminal is connected to the second sampling capacitance. The second feedback capacitance is connected between the second input terminal and the second output terminal. An amplification factor of the second variable gain amplifier is determined by a ratio between a capacitance value of the second sampling capacitance and a capacitance value of the second feedback capacitance. The first variable gain amplifier and the second variable gain amplifier constitute a switched capacitor type variable gain amplifier. The selection switch switches connection among the first variable gain amplifier, the second variable gain amplifier, and the load circuit such that the first variable gain amplifier and the load circuit are connected to each other when the amplification factor of the first variable gain amplifier is a predetermined gain or less, and the second variable gain amplifier is connected between the first variable gain amplifier and the load circuit when the amplification factor of the first variable gain amplifier is larger than the predetermined gain.

According to a second aspect of the present invention, in the first aspect, the semiconductor device may further include a control circuit configured to halt the second variable gain amplifier when the amplification factor of the first variable gain amplifier is the predetermined gain or less.

According to a third aspect of the present invention, in the first aspect, the second variable gain amplifier may be controlled so that sampling and amplifying of the second voltage signal are simultaneously performed.

According to a fourth aspect of the present invention, in the third aspect, the first variable gain amplifier and the second variable gain amplifier may be fully differential amplifiers. The first output terminal may include a first positive output terminal and a first negative output terminal. The second input terminal may include a second positive input terminal and a second negative input terminal. The second output terminal may include a second positive output terminal and a second negative output terminal. When the amplification factor of the first variable gain amplifier is the predetermined gain or less, a signal which is output from the first positive output terminal may be output as a positive output signal, and a signal which is output from the first negative output terminal may be output as a negative output signal. When the amplification factor of the first variable gain amplifier is larger than the predetermined gain, the first positive output terminal and the second positive input terminal may be electrically connected to each other, and the first negative output terminal and the second negative input terminal may be electrically connected to each other. When the amplification factor of the first variable gain amplifier is larger than the predetermined gain, a signal which is output from the second positive output terminal may be output as the positive output signal, and a signal which is output from the second negative output terminal may be output as the negative output signal.

According to a fifth aspect of the present invention, in the first aspect, the first variable gain amplifier and the second variable gain amplifier may be fully differential amplifiers. A common mode output voltage of the first operational amplifier may be smaller than a common mode input voltage of the first operational amplifier. A common mode output voltage of the second operational amplifier may be smaller than a common mode input voltage of the second operational amplifier.

According to a sixth aspect of the present invention, in the first aspect, the first sampling capacitance may include a first sub-sampling capacitance and a second sub-sampling capacitance. The first sub-sampling capacitance may hold a first signal level of the first voltage signal in a first period. The second sub-sampling capacitance may hold a second signal level of the first voltage signal in a second period which is different from the first period. The second signal level is different from the first signal level. The first variable gain amplifier may output a difference between the first signal level and the second signal level in a third period which is different from the first period and the second period.

According to a seventh aspect of the present invention, in the sixth aspect, the semiconductor device may further include a pixel array in which a plurality of pixels configured to generate the first voltage signal in accordance with incident light are arranged in a matrix form. A plurality of the first sampling capacitances corresponding to a plurality of columns of the pixel array may be arranged. A plurality of the first sub-sampling capacitances may simultaneously hold the first signal levels of the plurality of columns in the first period. A plurality of the second sub-sampling capacitances may simultaneously hold the second signal levels of the plurality of columns in the second period. The first variable gain amplifier may sequentially output differences between the first signal levels and the second signal levels of the plurality of columns in the third period.

According to an eighth aspect of the present invention, in the first aspect, the capacitance value of the second sampling capacitance may be set to be inversely proportional to a gain of the first variable gain amplifier.

According to a ninth aspect of the present invention, in the first aspect, the load circuit may be an analog to digital (AD) converter including a sampling capacitance. The first variable gain amplifier, the second variable gain amplifier, the selection switch, and the load circuit may be arranged in the same substrate.

BRIEF DESCRIPTION OF THE DRAWINGS

FIG. 2 is a reference diagram showing states in the semiconductor device according to the first embodiment of the present invention.

FIG. 18 is a reference diagram describing an effective load capacity to be driven by a variable gain amplifier mounted in the semiconductor device according to the fourth embodiment of the present invention and an effective load capacity to be driven by a variable gain amplifier in the related art.

DETAILED DESCRIPTION OF THE INVENTION

Embodiments of the present invention will be described with reference to the drawings. Semiconductor devices in the embodiments may be signal processing circuits configured to process analog signals. In other words, the semiconductor devices in the embodiments may be amplifier circuits configured to amplify analog signals.

First Embodiment

Figure 1:
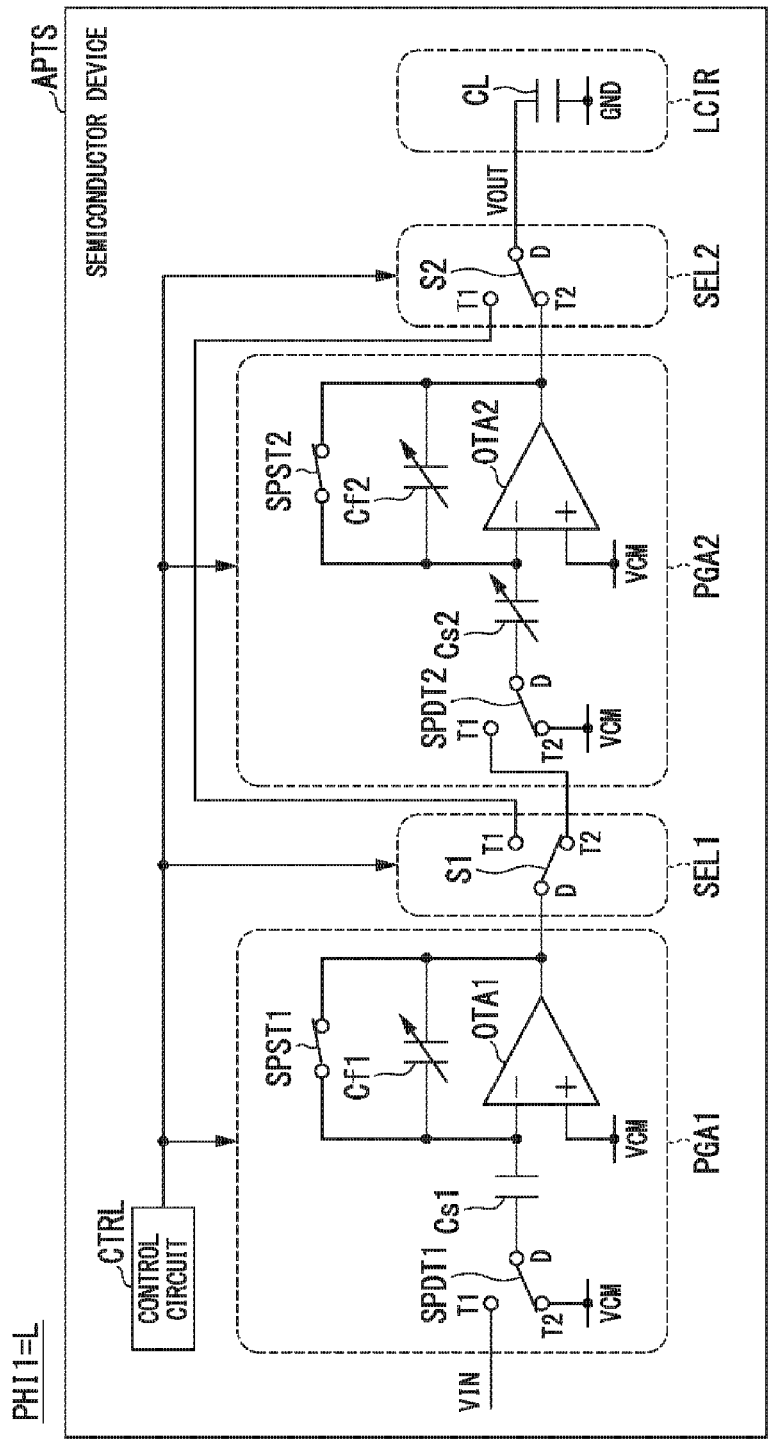
FIG. 1 is a circuit diagram showing a configuration of a semiconductor device according to a first embodiment of the present invention.

A first embodiment of the present invention will be described.
(Configuration)
A configuration of a semiconductor device APTS according to a first embodiment will be described using FIG. 1. FIG. 1 shows the configuration of the semiconductor device APTS. As shown in FIG. 1, the semiconductor device APTS includes a first variable gain amplifier PGA1, a second variable gain amplifier PGA2, a selection switch SEL1, a selection switch SEL2, a load circuit LCIR, and a control circuit CTRL.
(First Variable Gain Amplifier PGA1)
The first variable gain amplifier PGA1 includes a single-pole double-throw switch SPDT1, a first sampling capacitance Cs1, a single-pole single-throw switch SPST1, a first feedback capacitance Cf1, and a first operational amplifier OTA1.

The single-pole double-throw switch SPDT1 includes a first terminal T1, a second terminal T2, and a third terminal D. An input signal VIN is input to the first terminal T1 of the single-pole double-throw switch SPDT1. A reference voltage VCM is input to the second terminal T2 of the single-pole double-throw switch SPDT1. The third terminal D of the single-pole double-throw switch SPDT1 is connected to one of the first terminal T1 of single-pole double-throw switch SPDT1 and the second terminal T2 of the single-pole double-throw switch SPDT1.

The first sampling capacitance Cs1 includes a first terminal and a second terminal. The first terminal of the first sampling capacitance Cs1 is connected to the third terminal D of the single-pole double-throw switch SPDT1.

The single-pole single-throw switch SPST1 includes a first terminal and a second terminal. The first feedback capacitance Cf1 includes a first terminal and a second terminal. The first terminal of the single-pole single-throw switch SPST1 and the first terminal of the first feedback capacitance Cf1 are connected to the third terminal D of the single-pole double-throw switch SPDT1. The first feedback capacitance Cf1 is a variable capacitance.

The first operational amplifier OTA1 includes a first positive input terminal, a first negative input terminal (a first input terminal), and a first output terminal. The first positive input terminal of the first operational amplifier OTA1 is a non-inverting input terminal, and the first negative input terminal of the first operational amplifier OTA1 is an inverting input terminal. The reference voltage VCM is input to the first positive input terminal of the first operational amplifier OTA1. The first negative input terminal of the first operational amplifier OTA1 is connected to the second terminal of the first sampling capacitance Cs1. The first output terminal of the first operational amplifier OTA1 is connected to the second terminal of the single-pole single-throw switch SPST1 and the second terminal of the first feedback capacitance Cf1.

(Selection Switch SEL1)

The selection switch SEL1 includes a single-pole double-throw switch S1. The single-pole double-throw switch S1 includes the first terminal T1, the second terminal T2, and the third terminal D. The third terminal D of the single-pole double-throw switch S1 is connected to the first output terminal of the first operational amplifier OTA1. The third terminal D of the single-pole double-throw switch S1 is connected to one of the first terminal T1 of the single-pole double-throw switch S1 and the second terminal T2 of the single-pole double-throw switch S1.

(Second Variable Gain Amplifier PGA2)

The second variable gain amplifier PGA2 includes a single-pole double-throw switch SPDT2, a second sampling capacitance Cs2, a single-pole single-throw switch SPST2, a second feedback capacitance Cf2, and a second operational amplifier OTA2.

The single-pole double-throw switch SPDT2 includes a first terminal T1, a second terminal T2, and a third terminal D. The first terminal T1 of the single-pole double-throw switch SPDT2 is connected to the second terminal T2 of the single-pole double-throw switch S1. The reference voltage VCM is input to the second terminal T2 of the single-pole double-throw switch SPDT2. The third terminal D of the single-pole double-throw switch SPDT2 is connected to one of the first terminal T1 of the single-pole double-throw switch SPDT2 and the second terminal T2 of the single-pole double-throw switch SPDT2.

The second sampling capacitance Cs2 includes a first terminal and a second terminal. The first terminal of the second sampling capacitance Cs2 is connected to the third terminal D of the single-pole double-throw switch SPDT2.

The single-pole single-throw switch SPST2 includes a first terminal and a second terminal. The second feedback capacitance Cf2 includes a first terminal and a second terminal. The first terminal of the single-pole single-throw switch SPST2 and the first terminal of the second feedback capacitance Cf2 are connected to the second terminal of the second sampling capacitance Cs2. The second feedback capacitance Cf2 is a variable capacitance.

The second operational amplifier OTA2 includes a second positive input terminal, a second negative input terminal (a second input terminal), and a second output terminal. The second positive input terminal of the second operational amplifier OTA2 is a non-inverting input terminal, and the second negative input terminal of the second operational amplifier OTA2 is an inverting input terminal. The reference voltage VCM is input to the second positive input terminal of the second operational amplifier OTA2. The second negative input terminal of the second operational amplifier OTA2 is connected to the second terminal of the second sampling capacitance Cs2. The second output terminal of the second operational amplifier OTA2 is connected to the second terminal of the single-pole single-throw switch SPST2 and the second terminal of the second feedback capacitance Cf2. An output signal VOUT is output from the second output terminal of the second operational amplifier OTA2.

(Selection Switch SEL2)

The selection switch SEL2 includes a single-pole double-throw switch S2. The single-pole double-throw switch S2 includes a first terminal T1, a second terminal T2, and a third terminal D. The first terminal T1 of the single-pole double-throw switch S2 is connected to the first terminal T1 of the single-pole double-throw switch S1. The second terminal T2 of the single-pole double-throw switch S2 is connected to the second output terminal of the second operational amplifier OTA2. The third terminal D of the single-pole double-throw switch S2 is connected to one of the first terminal T1 of the single-pole double-throw switch S2 and the second terminal T2 of the single-pole double-throw switch S2.

In FIG. 1, the selection switch SEL1 and the selection switch SEL2 will be divided into two blocks and described. However, the selection switch SEL1 and the selection switch SEL2 actually operate as one functional block.

(Load Circuit LCIR)

The load circuit LCIR includes a load capacitance CL. The load capacitance CL includes a first terminal and a second terminal. The first terminal of the load capacitance CL is connected to the third terminal D of the single-pole double-throw switch S2. A ground voltage GND is input to the second terminal of the load capacitance CL.

The load circuit LCIR is any circuit having the load capacitance CL as an input capacitance. For example, the load circuit LCIR is a capacitor. The load circuit LCIR may be any one of a sample and hold circuit, an analog to digital (AD) converter, and the like. The load capacitance CL is a sum of load capacitances expected from the first terminal of the load capacitance CL. When the load circuit LCIR is a sample and hold circuit or an AD converter, the load capacitance CL is a sampling capacitance used to sample a signal.

(Control Circuit CTRL)

The control circuit CTRL controls the first variable gain amplifier PGA1, the second variable gain amplifier PGA2, the selection switch SEL1, and the selection switch SEL2.

As described above, the semiconductor device APTS includes the first variable gain amplifier PGA1, the second variable gain amplifier PGA2, the load circuit LCIR having a capacitive load (the load capacitance CL), the selection switch SEL1, and the selection switch SEL2. The first variable gain amplifier PGA1 includes the first sampling capacitance Cs1 configured to hold a first voltage signal (the input signal VIN) to be input, the first feedback capacitance Cf1, and the first operational amplifier OTA1. The first operational amplifier OTA1 includes a first input terminal (a first negative input terminal) and a first output terminal. The first input terminal of the first operational amplifier OTA1 is connected to the first sampling capacitance Cs1. The first feedback capacitance Cf1 is connected between the first input terminal and the first output terminal of the first operational amplifier OTA1. An amplification factor (a gain) of the first variable gain amplifier PGA1 is determined in accordance with a ratio of a capacitance value of the first sampling capacitance Cs1 to a capacitance value of the first feedback capacitance Cf1.

The second variable gain amplifier PGA2 includes the second sampling capacitance Cs2 configured to sample a second voltage signal output from the first variable gain amplifier PGA1, the second feedback capacitance Cf2, and the second operational amplifier OTA2. The second operational amplifier OTA2 includes a second input terminal (a second negative input terminal) and a second output terminal. The second input terminal of the second operational amplifier OTA2 is connected to the second sampling capacitance Cs2. The second feedback capacitance Cf2 is connected between the second input terminal and the second output terminal of the second operational amplifier OTA2. An amplification factor (a gain) of the second variable gain amplifier PGA2 is determined in accordance with a ratio of a capacitance value of the second sampling capacitance Cs2 to a capacitance value of the second feedback capacitance Cf2.

The first variable gain amplifier PGA1 and the second variable gain amplifier PGA2 constitute a switched capacitor type variable gain amplifier. The selection switch SEL1 and the selection switch SEL2 switches connection among the first variable gain amplifier PGA1, the second variable gain amplifier PGA2, the load circuit LCIR so that the first variable gain amplifier PGA1 and the load circuit LCIR are connected to each other when an amplification factor (an absolute value) of the first variable gain amplifier PGA1 is a predetermined gain or less. The selection switch SEL1 and the selection switch SEL2 switch connection among the first variable gain amplifier PGA1, the second variable gain amplifier PGA2, and the load circuit LCIR so that the second variable gain amplifier PGA2 is connected between the first variable gain amplifier PGA1 and the load circuit LCIR when the amplification factor (the absolute value) of the first variable gain amplifier PGA1 is larger than the predetermined gain.

The second variable gain amplifier PGA2 is controlled so that a second voltage signal is simultaneously sampled and amplified.

(Operation)

An operation of the semiconductor device APTS will be described with reference to FIGS. 1 and 2. The control circuit CTRL outputs a signal used to control a gain G1 of the first variable gain amplifier PGA1 and a gain G2 of the second variable gain amplifier PGA2. Absolute values of gains of the amplifiers are controlled so that |G1|=Cs1/Cf1 and |G2|=Cs2/Cf2 are satisfied. Cs1 is a capacitance value of the first sampling capacitance Cs1. Cf1 is a capacitance value of the first feedback capacitance Cf1. Cs2 is a capacitance value of the second sampling capacitance Cs2. Cf2 is a capacitance value of the second feedback capacitance Cf2. Reference numerals in the following expressions are the same as above. In other words, the gain G1 of the first variable gain amplifier PGA1 is determined in accordance with a ratio of the capacitance value of the first sampling capacitance Cs1 to the capacitance value of the first feedback capacitance Cf1. The gain G2 of the second variable gain amplifier PGA2 is determined in accordance with a ratio of the capacitance value of the second sampling capacitance Cs2 to the capacitance value of the second feedback capacitance Cf2.

FIG. 2 shows a relationship among a gain G of the semiconductor device APTS, the gain G1 of the first variable gain amplifier PGA1, the gain G2 of the second variable gain amplifier PGA2, a state of the single-pole double-throw switch S1, and a state of the single-pole double-throw switch S2. G=G1×G2 is satisfied. For example, depending on the conditions shown in FIG. 2, the gain G of the semiconductor device APTS, the gain G1 of the first variable gain amplifier PGA1, and the gain G2 of the second variable gain amplifier PGA2 are determined.

In FIG. 2, when the state of the single-pole double-throw switch S1 is T1, the first terminal T1 of the single-pole double-throw switch S1 is connected to the third terminal D of the single-pole double-throw switch S1. When the state of the single-pole double-throw switch S2 is T1, the first terminal T1 of the single-pole double-throw switch S2 is connected to the third terminal D of the single-pole double-throw switch S2. Therefore, when the state of the single-pole double-throw switch S1 is T1 and the state of the single-pole double-throw switch S2 is T1, the first variable gain amplifier PGA1 and the load circuit LCIR are connected to each other, and the second variable gain amplifier PGA2 is disconnected. When the state of the single-pole double-throw switch S1 is T2 and the state of the single-pole double-throw switch S2 is T2, the second variable gain amplifier PGA2 is connected between the first variable gain amplifier PGA1 and the load circuit LCIR. Therefore, a signal output from the first variable gain amplifier PGA1 is input to the second sampling capacitance Cs2. The output signal VOUT of a variable gain amplifier including the first variable gain amplifier PGA1 and the second variable gain amplifier PGA2 is a signal output from the second variable gain amplifier PGA2.

The control circuit CTRL outputs a control signal PHI1 to the first variable gain amplifier PGA1 and the second variable gain amplifier PGA2. An operation associated with the control signal PHI1 will be described below.

The control circuit CTRL outputs a signal used to control the selection switch SEL1 (the single-pole double-throw switch S1) and the selection switch SEL2 (the single-pole double-throw switch S2) in accordance with a value of the gain G. In the first embodiment, the states of the selection switch SEL1 and the selection switch SEL2 are T1 only when a value of the gain G (an absolute value of the gain G1) is 1 or less. In this case, a signal output from the first variable gain amplifier PGA1 reaches the load circuit LCIR without passing through the second variable gain amplifier PGA2. In other words, the output signal VOUT of the variable gain amplifier including the first variable gain amplifier PGA1 and the second variable gain amplifier PGA2 is a signal output from the first variable gain amplifier PGA1. This state corresponds to skip reading.

Figure 3:
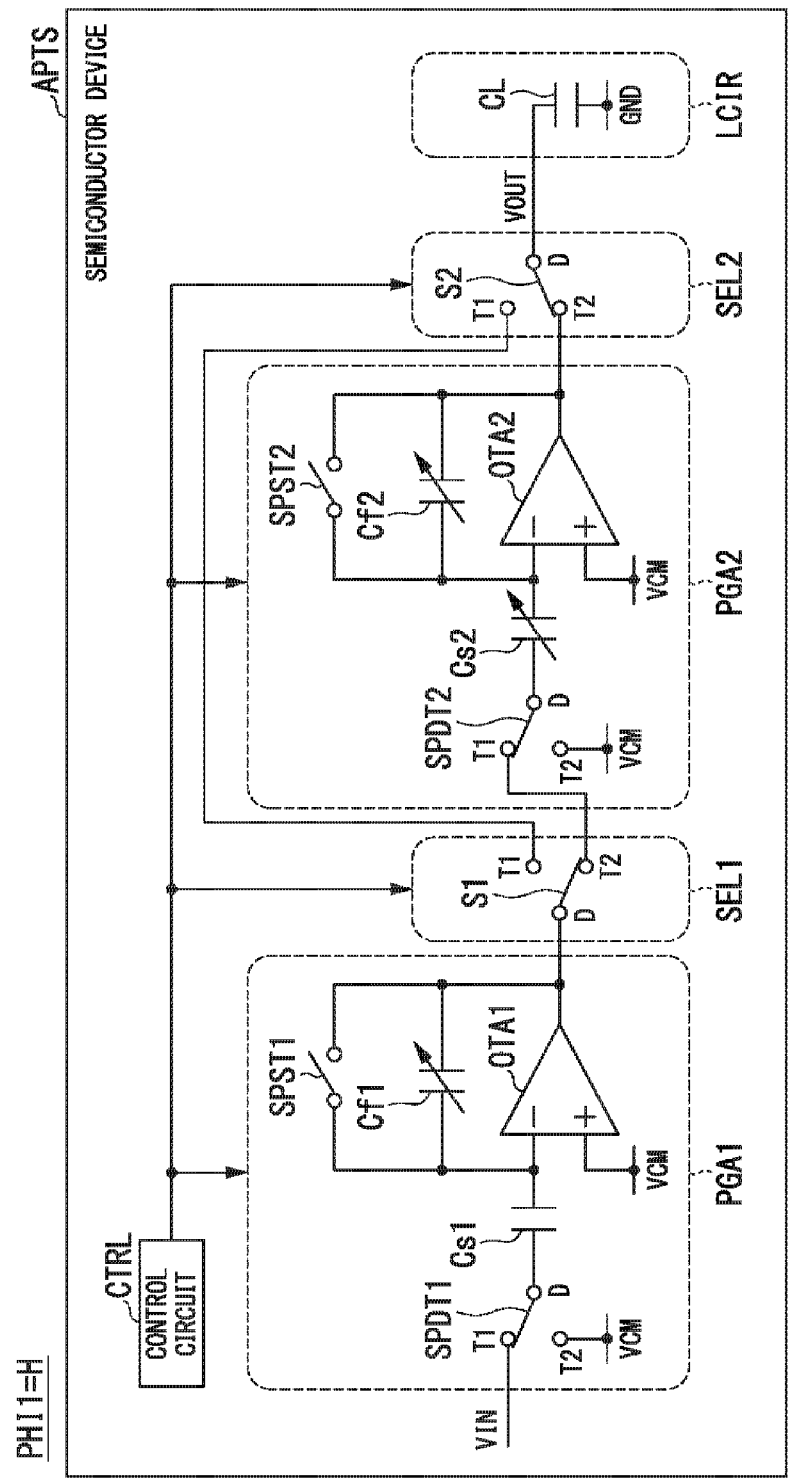
FIG. 3 is a circuit diagram showing a configuration of the semiconductor device according to the first embodiment of the present invention.
Figure 4:
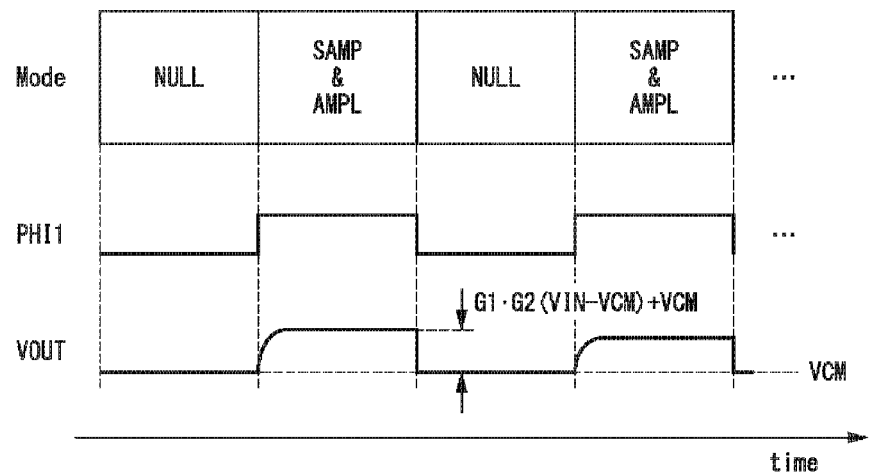
FIG. 4 is a timing chart describing an operation of the semiconductor device according to the first embodiment of the present invention.

An operation of the semiconductor device APTS will be described in greater detail with reference to FIGS. 1, 3, and 4. In FIG. 1, the control circuit CTRL outputs a signal used to control gains of the first variable gain amplifier PGA1 and the second variable gain amplifier PGA2 and the control signal PHI1 to the first variable gain amplifier PGA1 and the second variable gain amplifier PGA2. The control signal PHI1 is a signal in which a high level (an H level) and a low level (an L level) are repeated at regular intervals.

FIG. 1 shows a state of the semiconductor device APTS when the control signal PHI1 has an L level. FIG. 3 shows a state of the semiconductor device APTS when the control signal PHI1 has an H level. FIG. 4 shows an operation of the semiconductor device APTS. FIG. 4 shows a mode of the semiconductor device APTS, a waveform of the control signal PHI1, and a waveform of the output signal VOUT. A horizontal direction of FIG. 4 indicates time. A vertical direction of FIG. 4 indicates a voltage.

When the control signal PHI1 has an L level, the second terminal T2 and the third terminal D are connected to each other in the single-pole double-throw switch SPDT1 and the single-pole double-throw switch SPDT2 as shown in FIG. 1. When the control signal PHI1 has an H level, the first terminal T1 and the third terminal D are connected to each other in the single-pole double-throw switch SPDT1 and the single-pole double-throw switch SPDT2 as shown in FIG. 3. When the control signal PHI1 has the L level, the first terminal and the second terminal are short-circuited in the single-pole single-throw switch SPST1 and the single-pole single-throw switch SPST2 as shown in FIG. 1. When the control signal PHI1 has the H level, the first terminal and the second terminal are opened in the single-pole single-throw switch SPST1 and the single-pole single-throw switch SPST2 as shown in FIG. 3. A circuit controlled in this way is known as a butterfly type switched capacitor integrator. Since a detailed operation principle is described in Reference Literature 1, only the main points shown in FIG. 4 will be described in this specification.

Reference Literature 1: "Introduction to CMOS Analog Circuits," written by Kenji TANIGUCHI, CQ Publishing Co., Ltd., December 2004

An operation when the skip reading is not performed will be described. As shown in FIG. 4, the first variable gain amplifier PGA1 and the second variable gain amplifier PGA2 serving as the butterfly type switched capacitor integrator sample the reference voltage VCM and reset the first operational amplifier OTA1 and the second operational amplifier OTA2 during a period in which the control signal PHI1 has the L level (a NULL period). Thus, the output signal VOUT=VCM is output.

The first variable gain amplifier PGA1 and the second variable gain amplifier PGA2 simultaneously sample and amplify the input signal VIN during a period in which the control signal PHI1 has an H level (an SAMP & AMPL period). In this period, a gain of the first variable gain amplifier PGA1 is G1=−(Cs1/Cf1). In this period, a gain of the second variable gain amplifier PGA2 is G2=−(Cs2/Cf2). A phase of the output signal VOUT output from the second variable gain amplifier PGA2 is the same as a phase of the input signal VIN. A voltage value of the output signal VOUT is obtained by Expression (2)

$$VOUT=G2 \cdot G1 \cdot (VIN-VCM)+VCM \quad (2)$$

In Expression (2), VOUT is a voltage value of the output signal VOUT, VIN is a voltage value of the input signal VIN, and VCM is a voltage value of the reference voltage VCM. From Expression (2), an input voltage which is G1×G2 times the input voltage is obtained using the reference voltage VCM as a reference.

The first variable gain amplifier PGA1 and the second variable gain amplifier PGA2 correctly operate as an amplifier even when crawl type control disclosed in Reference Literature 1 has been performed. The single-pole double-throw switch SPDT1 and the single-pole double-throw switch SPDT2 when the crawl type control is performed differ only in that the first terminal T1 and the third terminal D are connected to each other when the control signal PHI1 has an L level, and the second terminal T2 and the third terminal D are selected when the control signal PHI1 has the H level. Operations of the single-pole single-throw switch SPST1 and the single-pole single-throw switch SPST2 are the same as operations of switches when butterfly type control is performed.

When the crawl type control is performed, the input signal VIN is sampled and the first operational amplifier OTA1 is reset in a period in which the control signal PHI1 has an L level. When the crawl type control is performed, amplification is performed using the reference voltage VCM as a reference in a period in which the control signal PHI1 has an H level. With such control, a gain of the first variable gain amplifier PGA1 is G1=Cs1/Cf1. With such control, a gain of the second variable gain amplifier PGA2 is G2=Cs2/Cf2. The phase of the output signal VOUT output from the second variable gain amplifier PGA2 is delayed by a cycle which is half that of the control signal PHI1 with respect to the phase of the input signal VIN.

(Advantages)

Advantages of the semiconductor device APTS will be described with reference to FIGS. 5 and 6.

Figure 5:
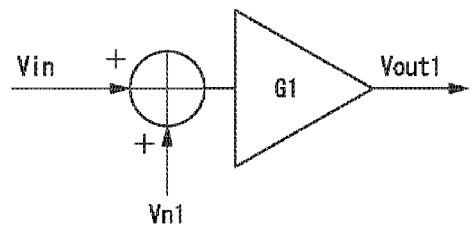
FIG. 5 is a conceptual diagram showing a model of the semiconductor device according to the first embodiment of the present invention.

FIG. 5 is a noise model of the first variable gain amplifier PGA1 operating with the gain G1 and an input referred noise Vn1. Power $RTI_{NOISE}$ of an input referred noise of this model is obtained by Expression (3). This model is the same as a noise model of the semiconductor device APTS when the skip reading is performed.

$$RTI_{NOISE}=Vn1^2 \quad (3)$$

Figure 6:
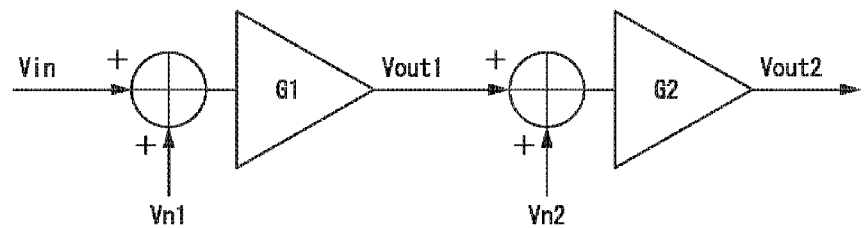
FIG. 6 is a conceptual diagram showing a model of the semiconductor device according to the first embodiment of the present invention.

FIG. 6 is a noise model when the first variable gain amplifier PGA1 operating with the gain G1 and the input referred noise Vn1 and the second variable gain amplifier PGA2 operating with the gain G2 and an input referred noise Vn2 are cascade-connected. The power $RTI_{NOISE}$ of the input referred noise in this model is obtained by Expression (4). This model is the same as a noise model of the semiconductor device APTS when the skip reading is not performed.

$$RTI_{NOISE}=Vn1^2+(Vn2G1)^2 \quad (4)$$

When the input signal VIN is amplified in the model shown in FIGS. 5 and 6, an influence of a second item of Expression (4) on the input referred noise can be ignored if the gain G1 is sufficiently larger than 1. However, when the gain G1 is 1, power of an input referred noise in Expression (4) is twice the power of an input referred noise when the input signal VIN is amplified by only the first variable gain amplifier PGA1.

(First Advantage)

When the variable gain amplifier operates with a low gain (G1=1 or the like), power of an input referred noise of a circuit of the semiconductor device APTS is obtained by Expression (3) due to the skip reading. For this reason, an increase in the input referred noise when the semiconductor device APTS having two amplifiers which are dependently connected to each other operates with the low gain can be reduced. As described above, the semiconductor device APTS can select a first signal process and a second signal process in accordance with a magnitude of an input voltage. The first signal process is suitable for high speed and high gain amplification because a two-stage amplifier is used. The second signal process is suitable for low-noise amplification because a single-stage amplifier is used. For this reason, a semiconductor device capable of achieving both high-speed and high-gain amplification, and low-noise amplification can be provided.

(Second Advantage)

When the skip reading is performed, the second variable gain amplifier PGA2 which is not used may be controlled to be in a halted state. In other words, the control circuit CTRL may halt the second variable gain amplifier PGA2 when the amplification factor of the first variable gain amplifier PGA1 is a predetermined gain or less. Thus, power consumption of the semiconductor device APTS can be reduced.

(Third Advantage)

In the semiconductor device APTS, when butterfly type control is performed on the second variable gain amplifier PGA2, a phase delay of the output signal VOUT input to the load circuit LCIR is constant regardless of the presence or absence of the skip reading. In other words, the second variable gain amplifier PGA2 is controlled such that sampling and amplification are simultaneously performed so that a phase delay of the output signal VOUT input to the load circuit LCIR when amplification is performed by only the first variable gain amplifier PGA1 is the same as a phase delay of the output signal VOUT input to the load circuit LCIR when amplification is performed by both of the first variable gain amplifier PGA1 and the second variable gain amplifier PGA2. Therefore, the semiconductor device APTS is used so that a phase delay compensation function required for crawl type control may be omitted. For this reason, no phase delay correction process performed inside the load circuit LCIR or at a stage subsequent to the load circuit LCIR is required.

Second Embodiment

A second embodiment of the present invention will be described.

(Configuration)

Figure 7:
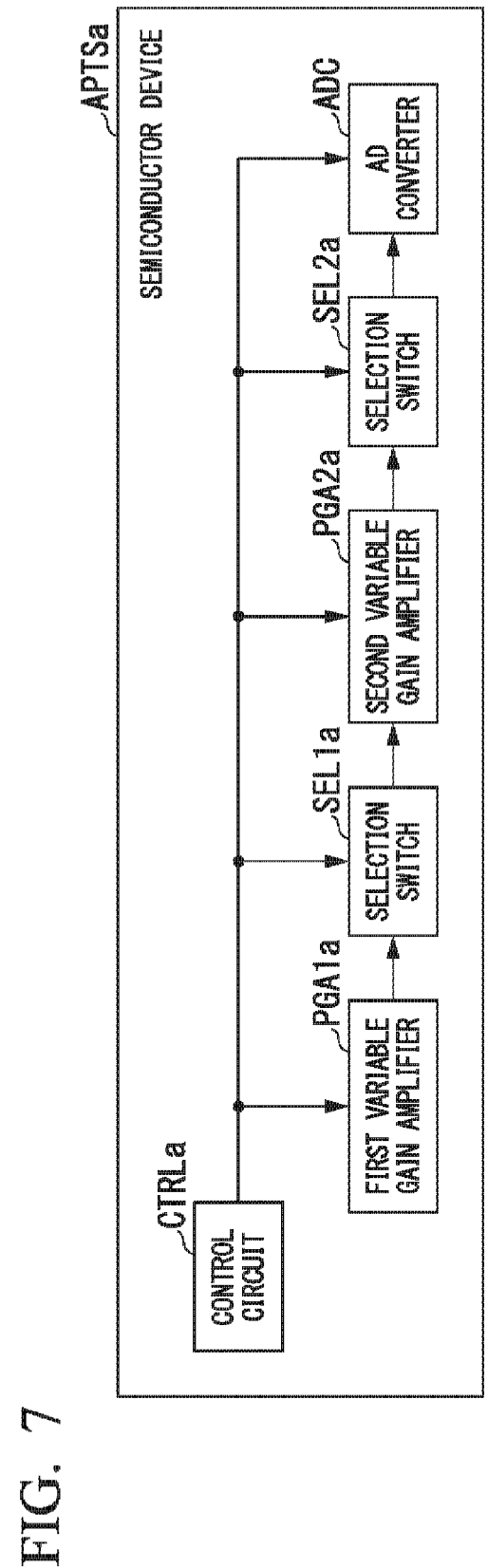
FIG. 7 is a block diagram showing a configuration of a semiconductor device according to a second embodiment of the present invention.

A configuration of a semiconductor device APTSa according to the second embodiment will be described using FIGS. 7 to 9. FIG. 7 shows the configuration of the semiconductor device APTSa. As shown in FIG. 7, the semiconductor device APTSa includes a first variable gain amplifier PGA1a, a second variable gain amplifier PGA2a, a selection switch SEL1a, a selection switch SEL2a, an AD converter ADC, and a control circuit CTRLa.

Figure 8:
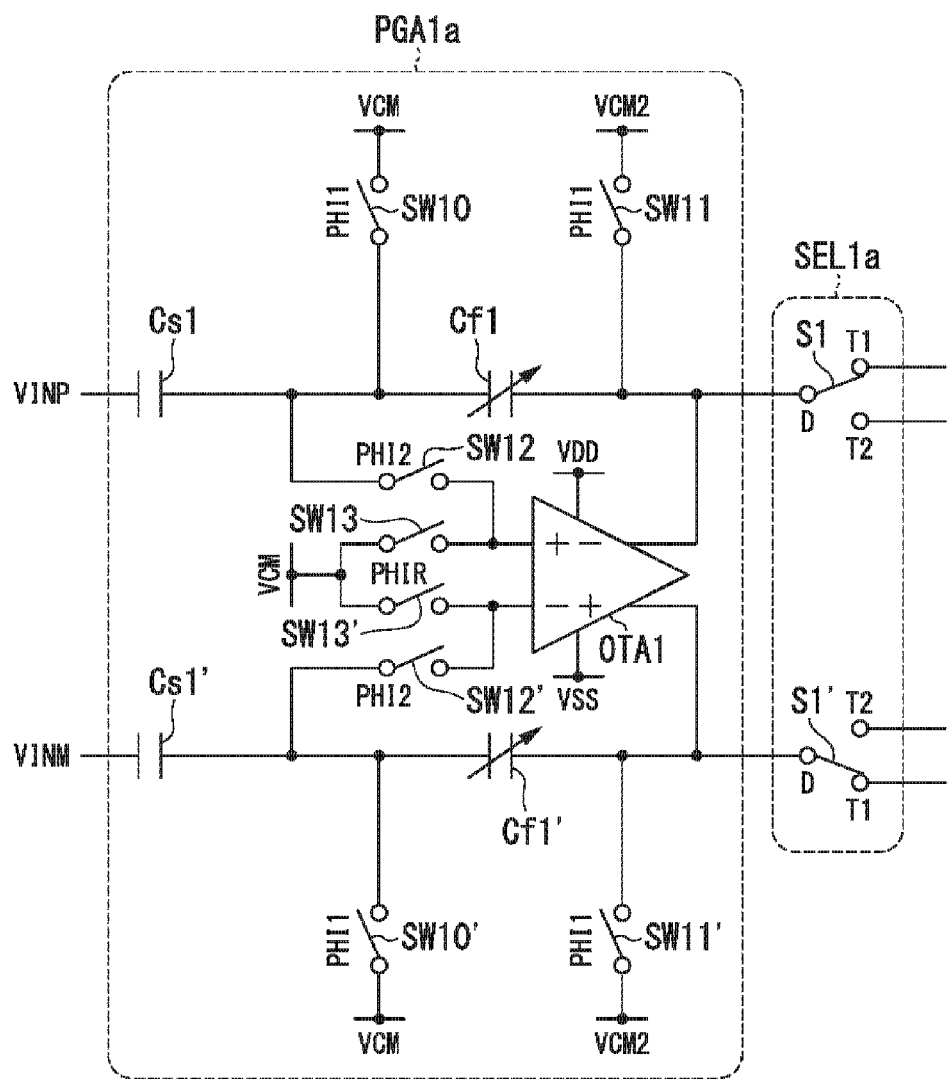
FIG. 8 is a circuit diagram showing a configuration of the semiconductor device according to the second embodiment of the present invention.
Figure 9:
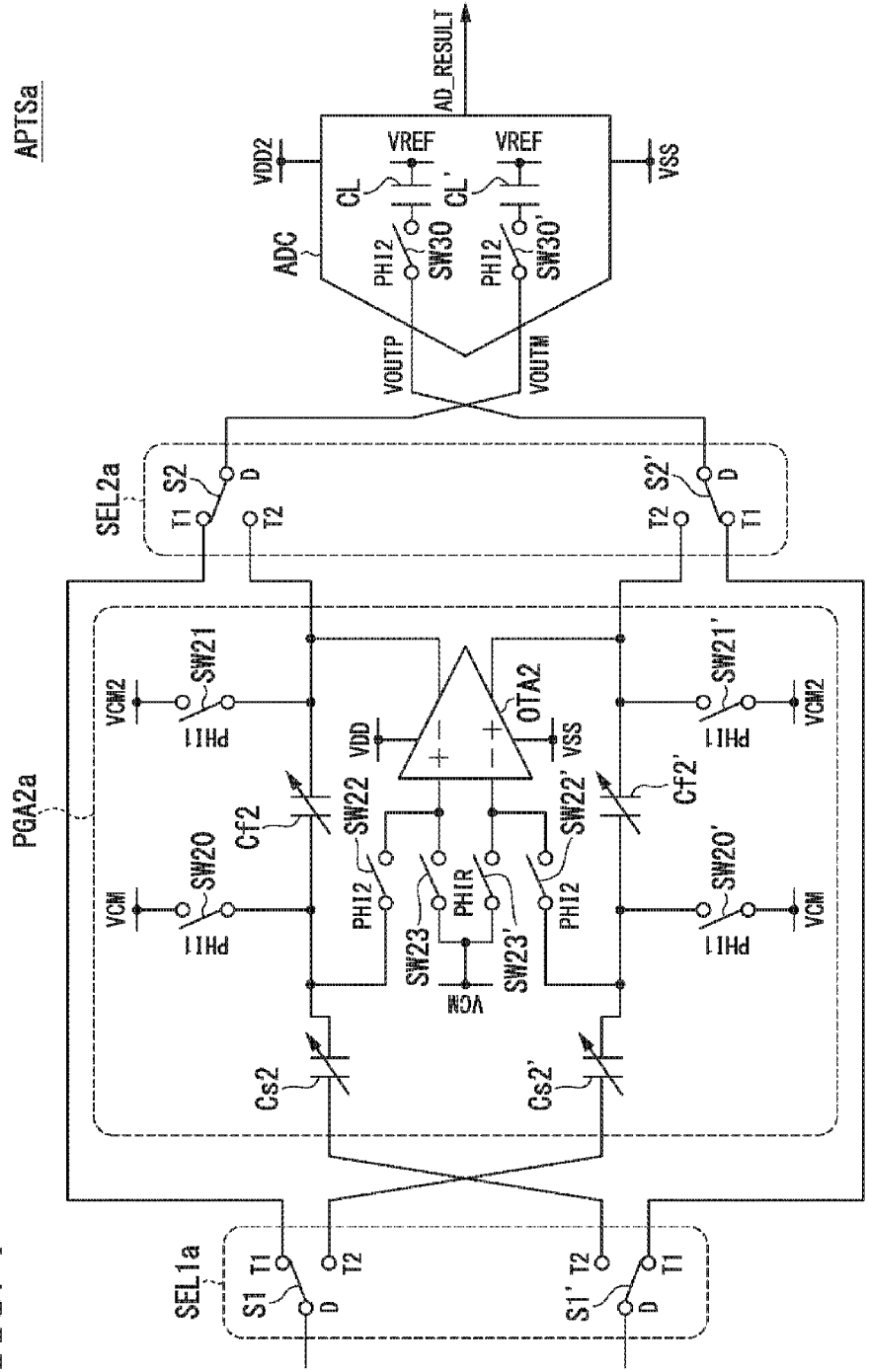
FIG. 9 is a circuit diagram showing a configuration of the semiconductor device according to the second embodiment of the present invention.

FIGS. 8 and 9 show detailed configurations of the semiconductor device APTSa. FIG. 8 shows a configuration of the first variable gain amplifier PGA1a and the selection switch SEL1a. FIG. 9 shows a configuration of the second variable gain amplifier PGA2a, the selection switch SEL1a, the selection switch SEL2a, and the AD converter ADC.

(First Variable Gain Amplifier PGA1a)

The first variable gain amplifier PGA1a includes a first sampling capacitance Cs1, a first sampling capacitance Cs1', single-pole single-throw switches SW10 to SW13, single-pole single-throw switches SW10' to SW13', a first feedback capacitance Cf1, a first feedback capacitance Cf1', and a first operational amplifier OTA1.

Each of the first sampling capacitance Cs1 and the first sampling capacitance Cs1' includes a first terminal and a second terminal. A positive input signal VINP is input to the first terminal of the first sampling capacitance Cs1. A negative input signal VINM is input to the first terminal of the first sampling capacitance Cs1'.

Each of the first feedback capacitance Cf1 and the first feedback capacitance Cf1' includes a first terminal and a second terminal. The first terminal of the first feedback capacitance Cf1 is connected to the second terminal of the first sampling capacitance Cs1. The first terminal of the first feedback capacitance Cf1' is connected to the second terminal of the first sampling capacitance Cs1'. The first feedback capacitance Cf1 and the first feedback capacitance Cf1' are variable capacitances.

Each of the single-pole single-throw switch SW10 and the single-pole single-throw switch SW11 includes a first terminal and a second terminal. The first terminal of the single-pole single-throw switch SW10 is connected to the second terminal of the first sampling capacitance Cs1. A first common mode voltage VCM is input to the second terminal of the single-pole single-throw switch SW10. The first terminal of the single-pole single-throw switch SW11 is connected to the second terminal of the first feedback capacitance Cf1. A second common mode voltage VCM2 is input to the second terminal of the single-pole single-throw switch SW11.

Each of the single-pole single-throw switch SW10' and the single-pole single-throw switch SW11' includes a first terminal and a second terminal. The first terminal of the single-pole single-throw switch SW10' is connected to the second terminal of the first sampling capacitance Cs1'. The first common mode voltage VCM is input to the second terminal of the single-pole single-throw switch SW10'. The first terminal of the single-pole single-throw switch SW11' is connected to the second terminal of the first feedback capacitance Cf1'. The second common mode voltage VCM2 is input to the second terminal of the single-pole single-throw switch SW11'.

Each of the single-pole single-throw switch SW12 and the single-pole single-throw switch SW13 includes a first terminal and a second terminal. The first terminal of the single-pole single-throw switch SW12 is connected to the second terminal of the first sampling capacitance Cs1. The first terminal of the single-pole single-throw switch SW13 is connected to the second terminal of the single-pole single-throw switch SW12. The first common mode voltage VCM is input to the second terminal of the single-pole single-throw switch SW13.

Each of the single-pole single-throw switch SW12' and the single-pole single-throw switch SW13' includes a first terminal and a second terminal. The first terminal of the single-pole single-throw switch SW12' is connected to the second terminal of the first sampling capacitance Cs1'. The first terminal of the single-pole single-throw switch SW13' is connected to the second terminal of the single-pole single-throw switch SW12'. The first common mode voltage VCM is input to the second terminal of the single-pole single-throw switch SW13'.

The first operational amplifier OTA1 includes a first positive input terminal (a first input terminal), a first negative input terminal (a first input terminal), a first positive output terminal (a first output terminal), and a first negative output terminal (a first output terminal). The first positive input terminal of the first operational amplifier OTA1 is a non-inverting input terminal, and the first negative input terminal of the first operational amplifier OTA1 is an inverting input terminal. The first positive input terminal of the first operational amplifier OTA1 is connected to the second terminal of the single-pole single-throw switch SW12 and the first terminal of the single-pole single-throw switch SW13. The first negative input terminal of the first operational amplifier OTA1 is connected to the second terminal of the single-pole single-throw switch SW12' and the first terminal of the single-pole single-throw switch SW13'. The first positive output terminal of the first operational amplifier OTA1 is connected to the second terminal of the first feedback capacitance Cf1'. The first negative output terminal of the first operational amplifier OTA1 is connected to the second terminal of the first feedback capacitance Cf1. The first operational amplifier OTA1 includes two power supply terminals, and a power supply voltage VDD and a power supply voltage VSS are input to the two power supply terminals.

(Selection Switch SEL1a)

The selection switch SEL1a includes a single-pole double-throw switch S1 and a single-pole double-throw switch S1'. The single-pole double-throw switch S1 includes a first terminal T1, a second terminal T2, and a third terminal D. The third terminal D of the single-pole double-throw switch S1 is connected to the first negative output terminal of the first operational amplifier OTA1. The third terminal D of the single-pole double-throw switch S1 is connected to one of the first terminal T1 of the single-pole double-throw switch S1 and the second terminal T2 of the single-pole double-throw switch S1.

The single-pole double-throw switch S1' includes a first terminal T1, a second terminal T2, and a third terminal D. The third terminal D of the single-pole double-throw switch S1' is connected to the first positive output terminal of the first operational amplifier OTA1. The third terminal D of the single-pole double-throw switch S1' is connected to one of the first terminal T1 of the single-pole double-throw switch S1' and the second terminal T2 of the single-pole double-throw switch S1'.

(Second Variable Gain Amplifier PGA2a)

The second variable gain amplifier PGA2a includes a second sampling capacitance Cs2, a second sampling capacitance Cs2', single-pole single-throw switches SW20 to SW23, single-pole single-throw switches SW20' to SW23', a second feedback capacitance Cf2, a second feedback capacitance Cf2', and a second operational amplifier OTA2.

Each of the second sampling capacitance Cs2 and the second sampling capacitance Cs2' includes a first terminal and a second terminal. The first terminal of the second sampling capacitance Cs2 is connected to the second terminal T2 of the single-pole double-throw switch S1'. The first terminal of the second sampling capacitance Cs2' is connected to the second terminal T2 of the single-pole double-throw switch S1.

Each of the second feedback capacitance Cf2 and the second feedback capacitance Cf2' includes a first terminal and a second terminal. The first terminal of the second feedback capacitance Cf2 is connected to the second terminal of the second sampling capacitance Cs2. The first terminal of the second feedback capacitance Cf2' is connected to the second terminal of the second sampling capacitance Cs2'. The second feedback capacitance Cf2 and the second feedback capacitance Cf2' are variable capacitances.

Each of the single-pole single-throw switch SW20 and the single-pole single-throw switch SW21 includes a first terminal and a second terminal. The first terminal of the single-pole single-throw switch SW20 is connected to the second terminal of the second sampling capacitance Cs2. The first common mode voltage VCM is input to the second terminal of the single-pole single-throw switch SW20. The first terminal of the single-pole single-throw switch SW21 is connected to the second terminal of the second feedback capacitance Cf2. The second common mode voltage VCM2 is input to the second terminal of the single-pole single-throw switch SW21.

Each of the single-pole single-throw switch SW20' and the single-pole single-throw switch SW21' includes a first terminal and a second terminal. The first terminal of the single-pole single-throw switch SW20' is connected to the second terminal of the second sampling capacitance Cs2'. The first common mode voltage VCM is input to the second terminal of the single-pole single-throw switch SW20'. The first terminal of the single-pole single-throw switch SW21' is connected to the second terminal of the second feedback capacitance Cf2'. The second common mode voltage VCM2 is input to the second terminal of the single-pole single-throw switch SW21'.

Each of the single-pole single-throw switch SW22 and the single-pole single-throw switch SW23 includes a first terminal and a second terminal. The first terminal of the single-pole single-throw switch SW22 is connected to the second terminal of the second sampling capacitance Cs2. The first terminal of the single-pole single-throw switch SW23 is connected to the second terminal of the single-pole single-throw switch SW22. The first common mode voltage VCM is input to the second terminal of the single-pole single-throw switch SW23.

Each of the single-pole single-throw switch SW22' and the single-pole single-throw switch SW23' includes a first terminal and a second terminal. The first terminal of the single-pole single-throw switch SW22' is connected to the second terminal of the second sampling capacitance Cs2'. The first terminal of the single-pole single-throw switch SW23' is connected to the second terminal of the single-pole single-throw switch SW22'. The first common mode voltage VCM is input to the second terminal of the single-pole single-throw switch SW23'.

The second operational amplifier OTA2 includes a second positive input terminal (a second input terminal), a second negative input terminal (a second input terminal), a second positive output terminal (a second output terminal), and a second negative output terminal (a second output terminal). The second positive input terminal of the second operational amplifier OTA2 is a non-inverting input terminal, and the second negative input terminal of the second operational amplifier OTA2 is an inverting input terminal. The second positive input terminal of the second operational amplifier OTA2 is connected to the second terminal of the single-pole single-throw switch SW22 and the first terminal of the single-pole single-throw switch SW23. The second negative input terminal of the second operational amplifier OTA2 is connected to the second terminal of the single-pole single-throw switch SW22' and the first terminal of the single-pole single-throw switch SW23'. The second positive output terminal of the second operational amplifier OTA2 is connected to the second terminal of the second feedback capacitance Cf2'. The second negative output terminal of the second operational amplifier OTA2 is connected to the second terminal of the second feedback capacitance Cf2. The second operational amplifier OTA2 includes two power supply terminals, and a power supply voltage VDD and a power supply voltage VSS are input to the two power supply terminals. A positive output signal VOUTP is output from the second positive output terminal of the second operational amplifier OTA2. A negative output signal VOUTM is output from the second negative output terminal of the second operational amplifier OTA2.

(Selection Switch SEL2a)

The selection switch SEL2a includes a single-pole double-throw switch S2 and a single-pole double-throw switch S2'. The single-pole double-throw switch S2 includes a first terminal T1, a second terminal T2, and a third terminal D. The first terminal T1 of the single-pole double-throw switch S2 is connected to the first terminal T1 of the single-pole double-throw switch S1. The second terminal T2 of the single-pole double-throw switch S2 is connected to the second negative output terminal of the second operational amplifier OTA2. The third terminal D of the single-pole double-throw switch S1 is connected to one of the first terminal T1 of the single-pole double-throw switch S1 and the second terminal T2 of the single-pole double-throw switch S1.

The single-pole double-throw switch S2' includes a first terminal T1, a second terminal T2, and a third terminal D. The first terminal T1 of the single-pole double-throw switch S2' is connected to the first terminal T1 of the single-pole double-throw switch S1'. The second terminal T2 of the single-pole double-throw switch ST is connected to the second positive output terminal of the second operational amplifier OTA2. The third terminal D of the single-pole double-throw switch S1' is connected to one of the first terminal T1 of the single-pole double-throw switch S1' and the second terminal T2 of the single-pole double-throw switch S1'.

In FIGS. 8 and 9, the selection switch SEL1a and the selection switch SEL2a will be divided into two blocks and described. However, the selection switch SEL1a and the selection switch SEL2a actually operate as one functional block.

(AD Converter ADC)

An AD converter ADC includes a single-pole single-throw switch SW30, a single-pole single-throw switch SW30', a load capacitance CL, and a load capacitance CL'.

Each of the single-pole single-throw switch SW30 and the single-pole single-throw switch SW30' includes a first terminal and a second terminal. The first terminal of the single-pole single-throw switch SW30 is connected to the third terminal D of the single-pole double-throw switch S2'. The first terminal of the single-pole single-throw switch SW30' is connected to the third terminal D of the single-pole double-throw switch S2.

Each of the load capacitance CL and the load capacitance CL' includes a first terminal and a second terminal. The first terminal of the load capacitance CL is connected to the second terminal of the single-pole single-throw switch SW30. A reference voltage VREF is input to the second terminal of the load capacitance CL. The first terminal of the load capacitance CL' is connected to the second terminal of the single-pole single-throw switch SW30'. The reference voltage VREF is input to the second terminal of the load capacitance CL'. The load capacitance CL and the load capacitance CL' are sampling capacitances configured to sample signals.

In the AD converter ADC, a configuration other than the single-pole single-throw switch SW30, the single-pole single-throw switch SW30', the load capacitance CL, and the load capacitance CL' will be omitted in FIG. 9. The AD converter ADC is a load circuit including capacitive loads (the load capacitance CL and the load capacitance CL'). The AD converter ADC converts a difference between the positive output signal VOUTP and the negative output signal VOUTM into a digital signal. The AD converter ADC outputs the digital signal as an AD converted result AD_RESULT.

(Control Circuit CTRLa)

The control circuit CTRLa controls the first variable gain amplifier PGA1a, the second variable gain amplifier PGA2a, the selection switch SEL1a, the selection switch SEL2a, and the AD converter ADC.

The first variable gain amplifier PGA1a and the second variable gain amplifier PGA2a are fully differential amplifiers. A first input terminal of the first variable gain amplifier PGA1a includes a first positive input terminal and a first negative input terminal. A first output terminal of the first variable gain amplifier PGA1a includes a first positive output terminal and a first negative output terminal. A second input terminal of the second variable gain amplifier PGA2a includes a second positive input terminal and a second negative input terminal. A second output terminal of the second variable gain amplifier PGA2a includes a second positive output terminal and a second negative output terminal.

When an amplification factor of the first variable gain amplifier PGA1a is a predetermined gain or less, a signal output from the first positive output terminal thereof is output as the positive output signal VOUTP, and a signal output from the first negative output terminal thereof is output as the negative output signal VOUTM. When the amplification factor of the first variable gain amplifier PGA1a is larger than the predetermined gain, the first positive output terminal thereof and the second positive input terminal thereof are electrically connected to each other, and the first negative output terminal thereof and the second negative input terminal thereof are electrically connected to each other. When the amplification factor of the first variable gain amplifier PGA1a is larger than the predetermined gain, a signal output from the second positive output terminal thereof is output as the positive output signal VOUTP, and a signal output from the second negative output terminal thereof is output as the negative output signal VOUTM.

The first variable gain amplifier PGA1a and the second variable gain amplifier PGA2a are the fully differential amplifiers. A common mode output voltage of the first operational amplifier OTA1 is smaller than a common mode input voltage of the first operational amplifier OTA1. A common mode output voltage of the second operational amplifier OTA2 is smaller than a common mode input voltage of the second operational amplifier OTA2. The common mode input voltages of the first operational amplifier OTA1 and the second operational amplifier OTA2 are reference voltages used to determine differences between voltages of signals input to the first positive input terminals thereof or the second positive input terminals thereof and voltages of signals input to the first negative input terminals thereof or the second negative input terminals thereof. For example, the common mode input voltages of the first operational amplifier OTA1 and the second operational amplifier OTA2 are central voltages of voltages of signals input to the first positive input terminals thereof or the second positive input terminals thereof and voltages of signals input to the first negative input terminals thereof or the second negative input terminal thereof. The common mode output voltages of the first operational amplifier OTA1 and the second operational amplifier OTA2 are reference voltages used to determine differences between voltages of signals output from the first positive output terminals thereof or the second positive output terminals thereof and voltages of signals output from the first negative output terminals thereof or the second negative output terminals thereof. For example, the common mode output voltages of the first operational amplifier OTA1 and the second operational amplifier OTA2 are central voltages of voltages of signals output from the first positive output terminals thereof or the second positive output terminals thereof and voltages of signals of the first negative output terminals thereof or the second negative output terminals thereof.

(Operation)

Figure 10:
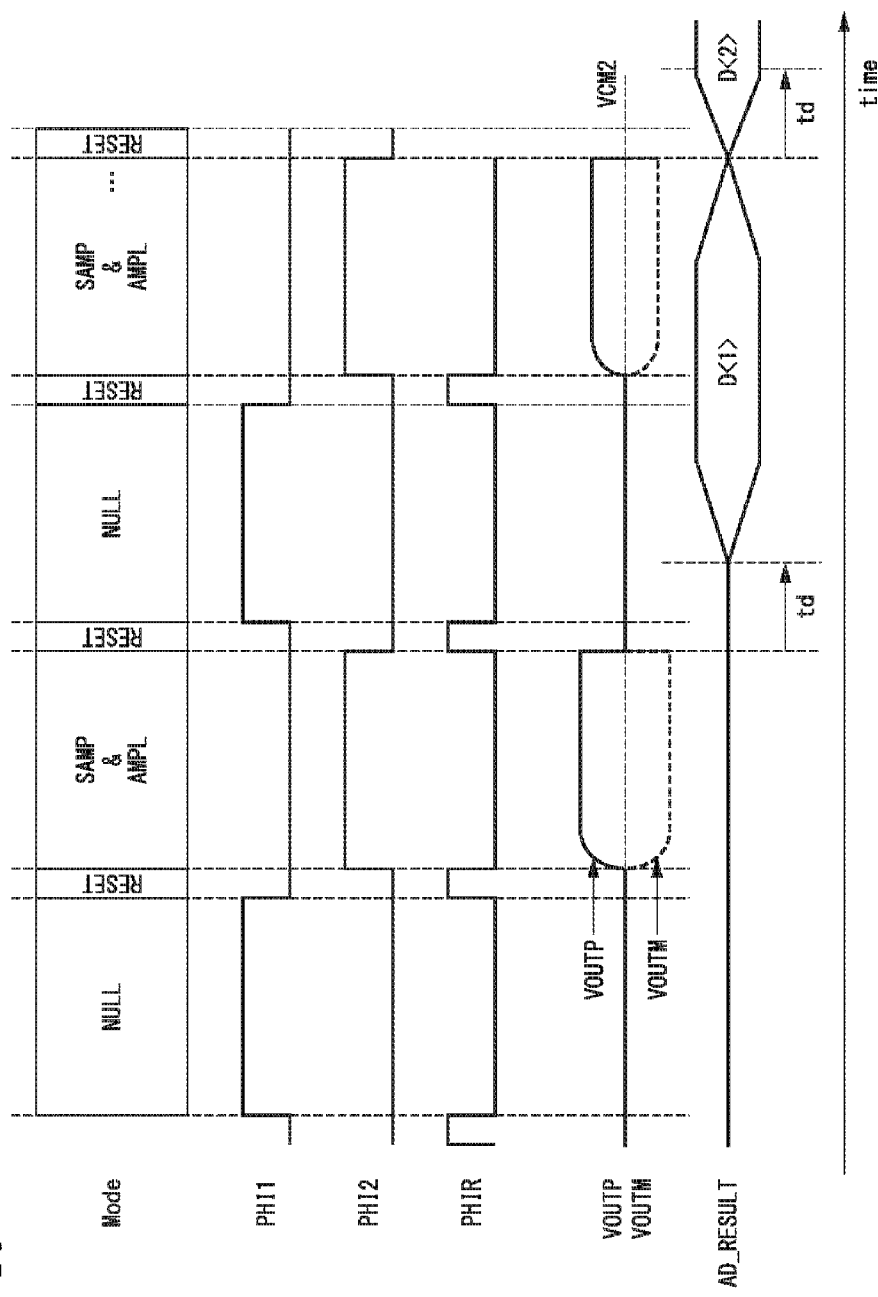
FIG. 10 is a timing chart describing an operation of the semiconductor device according to the second embodiment of the present invention.

An operation of the semiconductor device APTSa will be described with reference to FIGS. 7 to 10. FIG. 10 shows the operation of the semiconductor device APTSa. FIG. 10 shows a mode of the semiconductor device APTSa, waveforms of control signals PHI1, PHI2, and PHIR, a waveform of a positive output signal VOUTP, a waveform of a negative output signal VOUTM, and a state of an AD converted result AD_RESULT. A horizontal direction of FIG. 10 indicates time. A vertical direction of FIG. 10 indicates a voltage.

The control circuit CTRLa outputs the control signal PHI1, the control signal PHI2, and the control signal PHIR to the first variable gain amplifier PGA1a and the second variable gain amplifier PGA2a. The control circuit CTRLa outputs the control signal PHI2 to the AD converter ADC.

The control circuit CTRLa outputs signals used to control the selection switch SEL1a, the selection switch SEL2a, the first feedback capacitance Cf1, the first feedback capacitance Cf1', the second feedback capacitance Cf2, the second feedback capacitance Cf2', the second sampling capacitance Cs2, and the second sampling capacitance Cs2'. Control in the selection switch SEL1a, the selection switch SEL2a, and the above-described capacitances is the same as control in the first embodiment. For this reason, an operation associated with the control signal PHI1, the control signal PHI2, and the control signal PHIR will be mainly described below.

In the single-pole single-throw switches SW10, SW11, SW10', SW11', SW20, SW21, SW20', and SW21', when the control signal PHI1 has an H level, the first terminals thereof and the second terminals thereof are short-circuited. In the single-pole single-throw switches, when the control signal PHI1 has an L level, the first terminals thereof and the second terminals thereof are opened.

In the single-pole single-throw switches SW12, SW12', SW22, SW22', SW30, and SW30', when the control signal PHI2 has the H level, the first terminals thereof and the second terminals thereof are short-circuited. In the single-pole single-throw switches, when the control signal PHI2 has the L level, the first terminals thereof and the second terminals thereof are opened.

In the single-pole single-throw switches SW13, SW13', SW23, and SW23', when the control signal PHIR has the H level, the first terminals thereof and the second terminals thereof are short-circuited. In the single-pole single-throw switches, when the control signal PHIR has the L level, the first terminals thereof and the second terminals thereof are opened.

The first variable gain amplifier PGA1a controlled in this way operates as the butterfly type switched capacitor integrator disclosed in Reference Literature 1. In the first variable gain amplifier PGA1a, a positive input signal (VINP) is input to a non-inverting input terminal (a first positive input terminal) of the first operational amplifier OTA1, and a negative input signal (VINM) is input to an inverting input terminal (a first negative input terminal) of the first operational amplifier OTA1. For this reason, the first variable gain amplifier PGA1a operates as a non-inverting amplifier circuit. A gain of the first variable gain amplifier PGA1a is G1=Cs1/Cf1. In other words, when the skip reading is performed, an output signal of the semiconductor device APTSa is obtained by Expression (5).

$$VOUTP-VOUTM=(Cs1/Cf1)\times(VINP-VINM) \quad (5)$$

In Expression (5), VOUTP is a voltage value of the positive output signal VOUTP, and VOUTM is a voltage value of the negative output signal VOUTM. VINP is a voltage value of the positive input signal VINP, and VINM is a voltage value of the negative input signal VINM. Cs1 is a capacitance value of the first sampling capacitance Cs1 or the first sampling capacitance Cs1', and Cf1 is a capacitance value of the first feedback capacitance Cf1 or the first feedback capacitance Cf1'.

When the skip reading is performed, the positive output signal VOUTP of the semiconductor device APTSa is a signal output from the first positive output terminal of the first variable gain amplifier PGA1a. When the skip reading is performed, the negative output signal VOUTM of the semiconductor device APTSa is a signal output from the first negative output terminal of the first variable gain amplifier PGA1a.

As shown in FIGS. 8 and 9, two wires configured to connect the first variable gain amplifier PGA1a and the second variable gain amplifier PGA2a intersect. A non-inverting output terminal (a first positive output terminal) of the first operational amplifier OTA1 is connected to a non-inverting input terminal (a second positive input terminal) of the second operational amplifier OTA2, and an inverting output terminal (a first negative output terminal) of the first operational amplifier OTA1 is connected to an inverting input terminal (a second negative input terminal) of the second operational amplifier OTA2.

With the above-described control, the second variable gain amplifier PGA2a operates as a butterfly type switched capacitor integrator. Furthermore, with the above-described connection, the second variable gain amplifier PGA2a operates as a non-inverting amplifier circuit. A gain of the second variable gain amplifier PGA2a is G2=Cs2/Cf2. Therefore, when the skip reading is not performed, an output signal of the semiconductor device APTSa is obtained by Expression (6).

$$VOUTP-VOUTM=(Cs1/Cf1)\times(Cs2/Cf2)\times(VINP-VINM) \quad (6)$$

In Expression (6), Cs2 is a capacitance value of the second sampling capacitance Cs2 or the second sampling capacitance Cs2', and Cf2 is a capacitance value of the second feedback capacitance Cf2 or the second feedback capacitance Cf2'. In Expression (6), other reference numerals are the same as the reference numerals in Expression (5).

When the skip reading is not performed, the positive output signal VOUTP of the semiconductor device APTSa is a signal output from the second positive output terminal of the second variable gain amplifier PGA2a. When the skip reading is not performed, the negative output signal VOUTM of the semiconductor device APTSa is a signal output from the second negative output terminal of the second variable gain amplifier PGA2a.

Since the first variable gain amplifier PGA1a and the second variable gain amplifier PGA2a are the butterfly type switched capacitor integrators, phase delays of output signals generated due to the first variable gain amplifier PGA1a and the second variable gain amplifier PGA2a are zero.

In the first variable gain amplifier PGA1a, in a period in which the control signal PHI1 has the H level, voltages of the first positive input terminal of the first operational amplifier OTA1 and the first negative input terminal thereof are set to the first common mode voltage VCM, and voltages of the first positive output terminal of the first operational amplifier OTA1 and the first negative output terminal thereof are set to the second common mode voltage VCM2. In the second variable gain amplifier PGA2a, in a period in which the control signal PHI1 has the H level, voltages of the second positive input terminal of the second operational amplifier OTA2 and the second negative input terminal thereof are set to the first common mode voltage VCM, and voltages of the second positive output terminal of the second operational amplifier OTA2 and the second negative output terminal thereof are set to the second common mode voltage VCM2. Therefore, a voltage of the positive output signal VOUTP of the semiconductor device APTSa is VCM2, and a voltage of the negative output signal VOUTM of the semiconductor device APTSa is VCM2. States of signals of such periods are shown in a NULL period in FIG. 10.

In the first variable gain amplifier PGA1a, in a period in which the control signal PHIR has an H level, voltages of the first positive input terminal of the first operational amplifier OTA1 and the first negative input terminal thereof are set to the first common mode voltage VCM. In the second variable gain amplifier PGA2a, in the period in which the control signal PHIR has the H level, voltages of the second positive input terminal of the second operational amplifier OTA2 and the second negative input terminal thereof are set to the first common mode voltage VCM. Therefore, before an input signal is amplified, charges accumulated in parasitic capacitances of the first input terminal of the first variable gain amplifier PGA1a and the second input terminal of the second variable gain amplifier PGA2a are reset. States of signals of such periods are shown in a RESET period in FIG. 10.

Sampling and amplifying of the positive input signal VINP and the negative input signal VINM are simultaneously performed in a period in which the control signal PHI2 has an II level. The positive input signal VINP and the negative input signal VINM are amplified as shown in Expression (5) or Expression (6). Thus, the positive input signal VINP and the negative input signal VINM are output as differential signals centered on the second common mode voltage VCM2. States of signals in this period are shown in an SAMP & AMPL period in FIG. 10.

The AD converter ADC continues sampling the positive output signal VOUTP and the negative output signal VOUTM from the first variable gain amplifier PGA1a or the second variable gain amplifier PGA2a using the load capacitance CL and the load capacitance CL' in the period in which the control signal PHI2 has the H level. When the control signal PHI2 transitions from the H level to an L level, the AD converter ADC starts an AD conversion of the sampled voltage signal. After a predetermined time td elapses from a timing at which the AD conversion is started, the AD converter ADC outputs (updates) an AD converted result AD_RESULT.

(Fourth Advantage)

Inventive ideas are applied to wires used to connect the first variable gain amplifier PGA1a and the second variable gain amplifier PGA2a. For this reason, as described using Expression (5) and Expression (6), in the semiconductor device APTSa, positive and negative polarities of signals input to the AD converter ADC are kept to be the same as positive and negative polarities of input signals at all times. Therefore, a process of reversing a polarity of a signal in a circuit inside the AD converter ADC or at a rear stage of the AD converter ADC in accordance with the presence or absence of the skip reading is unnecessary. For this reason, an operation can be simplified.

(Fifth Advantage)

When the semiconductor device APTSa performs zero point sampling (the NULL period of FIG. 10), the first common mode voltage VCM is input to the first terminals of the first feedback capacitance Cf1, the first feedback capacitance Cf1', the second feedback capacitance Cf2, and the second feedback capacitance Cf2', and the second common mode voltage VCM2 is input to the second terminals of the capacitances. In other words, the common mode input voltages of the first operational amplifier OTA1 and the second operational amplifier OTA2 are the first common mode voltage VCM, and the common mode output voltages of the first operational amplifier OTA1 and the second operational amplifier OTA2 are the second common mode voltage VCM2. The common mode output voltage of the first operational amplifier OTA1 may be smaller than the common mode input voltage of the first operational amplifier OTA1, and the common mode output voltage of the second operational amplifier OTA2 may be smaller than the common mode input voltage of the second operational amplifier OTA2. Thus, a common mode voltage of a signal to be processed can be shifted without adding a circuit such as a differential difference amplifier (DDA), an alternating current (AC) coupling circuit (a high pass filter), or the like. In other words, a common mode voltage of output signals from the first operational amplifier OTA1 and the second operational amplifier OTA2 operating at a high power supply voltage VDD can be shifted to a common mode voltage suitable for a signal process using the AD converter ADC operating at a low power supply voltage VDD2. Generally, an operation at a low voltage by the AD converter is advantageous for an operation with low power consumption. For this reason, power consumption in the entire semiconductor device APTSa can be reduced.

Third Embodiment

A third embodiment of the present invention will be described.

(Configuration)

Figure 11:
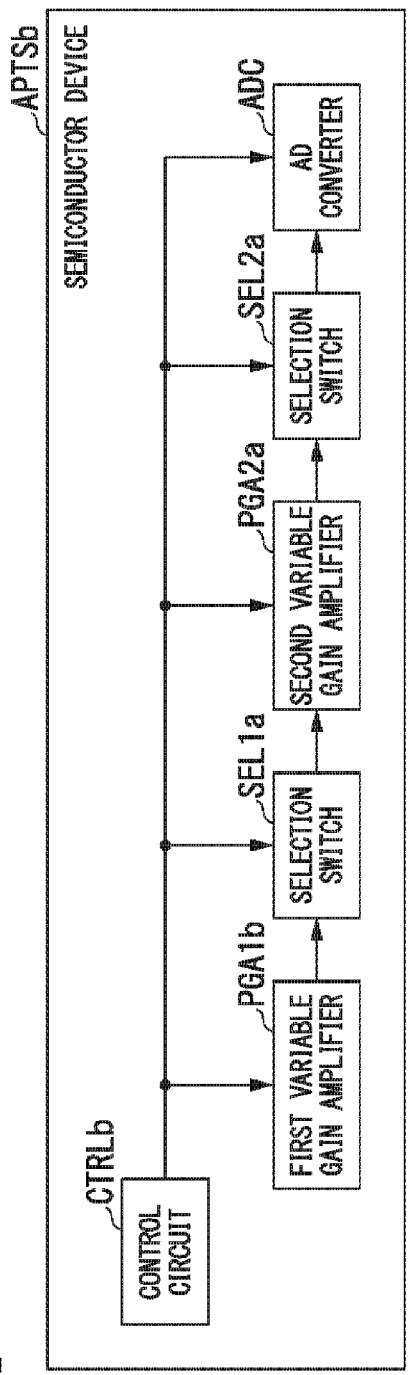
FIG. 11 is a block diagram showing a configuration of a semiconductor device according to a third embodiment of the present invention.

A configuration of a semiconductor device APTSb according to the third embodiment will be described using FIGS. 11 and 12. FIG. 11 shows the configuration of the semiconductor device APTSb. As shown in FIG. 11, the semiconductor device APTSb includes a control circuit CTRLb, a first variable gain amplifier PGA1b, a second variable gain amplifier PGA2a, a selection switch SEL1a, a selection switch SEL2a, and an AD converter ADC. A configuration other than the control circuit CTRLb and the first variable gain amplifier PGA1b is the same as the configuration in the second embodiment. For this reason, a description of the configuration other than the control circuit CTRLb and the first variable gain amplifier PGA1b will be omitted.

Figure 12:
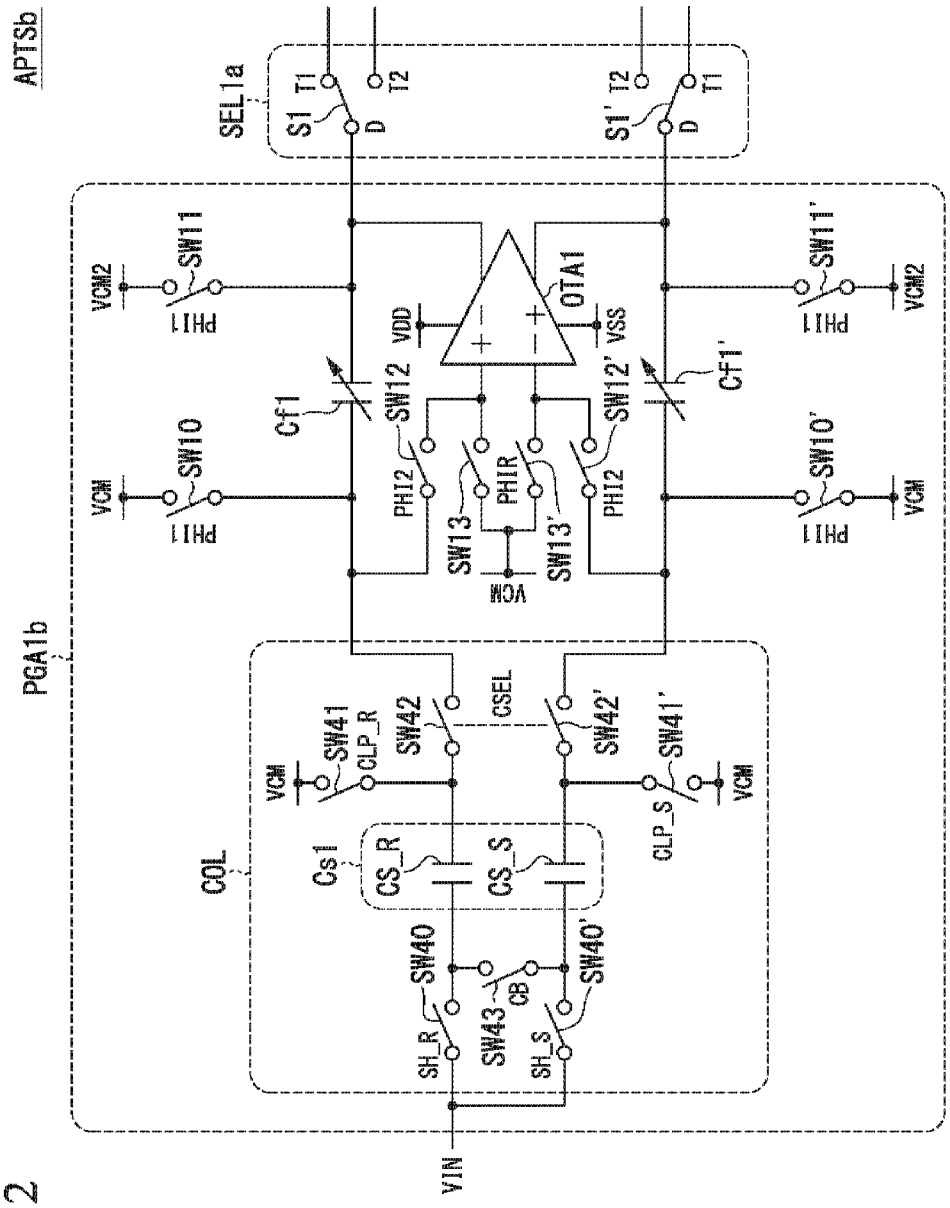
FIG. 12 is a circuit diagram showing a configuration of the semiconductor device according to the third embodiment of the present invention.

FIG. 12 shows a detailed configuration of the semiconductor device APTSb. FIG. 12 shows the configuration of the first variable gain amplifier PGA1b and the selection switch SEL1a.

(First Variable Gain Amplifier PGA1b)

The first variable gain amplifier PGA1b includes a column circuit COL, single-pole single-throw switches SW10 to SW13, single-pole single-throw switches SW10' to SW13', a first feedback capacitance Cf1, a first feedback capacitance Cf1', and a first operational amplifier OTA1. A configuration other than the column circuit COL is the same as the configuration in the second embodiment. For this reason, a description of the configuration other than the column circuit COL will be omitted.

The column circuit COL includes single-pole single-throw switches SW40 to SW43, single-pole single-throw switches SW40' to SW42', and a first sampling capacitance Cs1. The first sampling capacitance Cs1 includes a first sub-sampling capacitance CS_R and a second sub-sampling capacitance CS_S. The column circuit COL is a group which is created to facilitate the explanation of a fourth embodiment which will be described below. In the third embodiment, it is not necessary to distinguish the column circuit COL from other circuits.

Each of the single-pole single-throw switch SW40 and the single-pole single-throw switch SW40' includes a first terminal and a second terminal. An input signal VIN is input to the first terminals of the single-pole single-throw switch SW40 and the single-pole single-throw switch SW40'. The single-pole single-throw switch SW43 includes a first terminal and a second terminal. The first terminal of the single-pole single-throw switch SW43 is connected to the second terminal of the single-pole single-throw switch SW40. The second terminal of the single-pole single-throw switch SW43 is connected to the second terminal of the single-pole single-throw switch SW40'.

Each of the first sub-sampling capacitance CS_R and the second sub-sampling capacitance CS_S includes a first terminal and a second terminal. The first terminal of the first sub-sampling capacitance CS_R is connected to the second terminal of the single-pole single-throw switch SW40. The first terminal of the second sub-sampling capacitance CS_S is connected to the second terminal of the single-pole single-throw switch SW40'.

Each of the single-pole single-throw switch SW41 and the single-pole single-throw switch SW41' includes a first terminal and a second terminal. The first terminal of the single-pole single-throw switch SW41 is connected to the second terminal of the first sub-sampling capacitance CS_R. A first common mode voltage VCM is input to the second terminal of the single-pole single-throw switch SW41. The first terminal of the single-pole single-throw switch SW41' is connected to the second terminal of the second sub-sampling capacitance CS_S. The first common mode voltage VCM is input to the second terminal of the single-pole single-throw switch SW41'.

Each of the single-pole single-throw switch SW42 and the single-pole single-throw switch SW42' includes a first terminal and a second terminal. The first terminal of the single-pole single-throw switch SW42 is connected to the second terminal of the first sub-sampling capacitance CS_R. The second terminal of the single-pole single-throw switch SW42 is connected to the first terminal of the single-pole single-throw switch SW10 and the first terminal of the single-pole single-throw switch SW12. The first terminal of the single-pole single-throw switch SW42' is connected to the second terminal of the second sub-sampling capacitance CS_S. The second terminal of the single-pole single-throw switch SW42' is connected to the first terminal of the single-pole single-throw switches SW10' and the first terminal of the single-pole single-throw switch SW12'.

(Control Circuit CTRLb)

The control circuit CTRLb outputs a control signal PHI1 a control signal PHI2, and a control signal PHIR. In addition, the control circuit CTRLb outputs a control signal CLP_R, a control signal SH_R, a control signal CLP_S, a control signal SH_S, a control signal CSEL, and a control signal CB.

The single-pole single-throw switch SW40 is short-circuited only when the control signal SH_R has an H level. The single-pole single-throw switch SW40' is short-circuited only when the control signal SH_S has an H level. The single-pole single-throw switch SW41 is short-circuited only when the control signal CLP_R has an H level. The single-pole single-throw switch SW41' is short-circuited only when the control signal CLP_S has an H level. The single-pole single-throw switch SW42 and the single-pole single-throw switch SW42' are short-circuited only when the control signal CSEL has an H level. The single-pole single-throw switch SW43 is short-circuited only when the control signal CB has an H level.

As described above, the first sampling capacitance Cs1 has the first sub-sampling capacitance CS_R and the second sub-sampling capacitance CS_S. The first sub-sampling capacitance CS_R holds a first signal level of a first voltage signal (the input signal VIN) in a first period. The second sub-sampling capacitance CS_S holds a second signal level of the first voltage signal in a second period which is different from the first period. The second signal level is different from the first signal level. The first variable gain amplifier PGA1b outputs a difference between the first signal level and the second signal level in a third period which is different from the first period and the second period.

(Operation)

Figure 13:
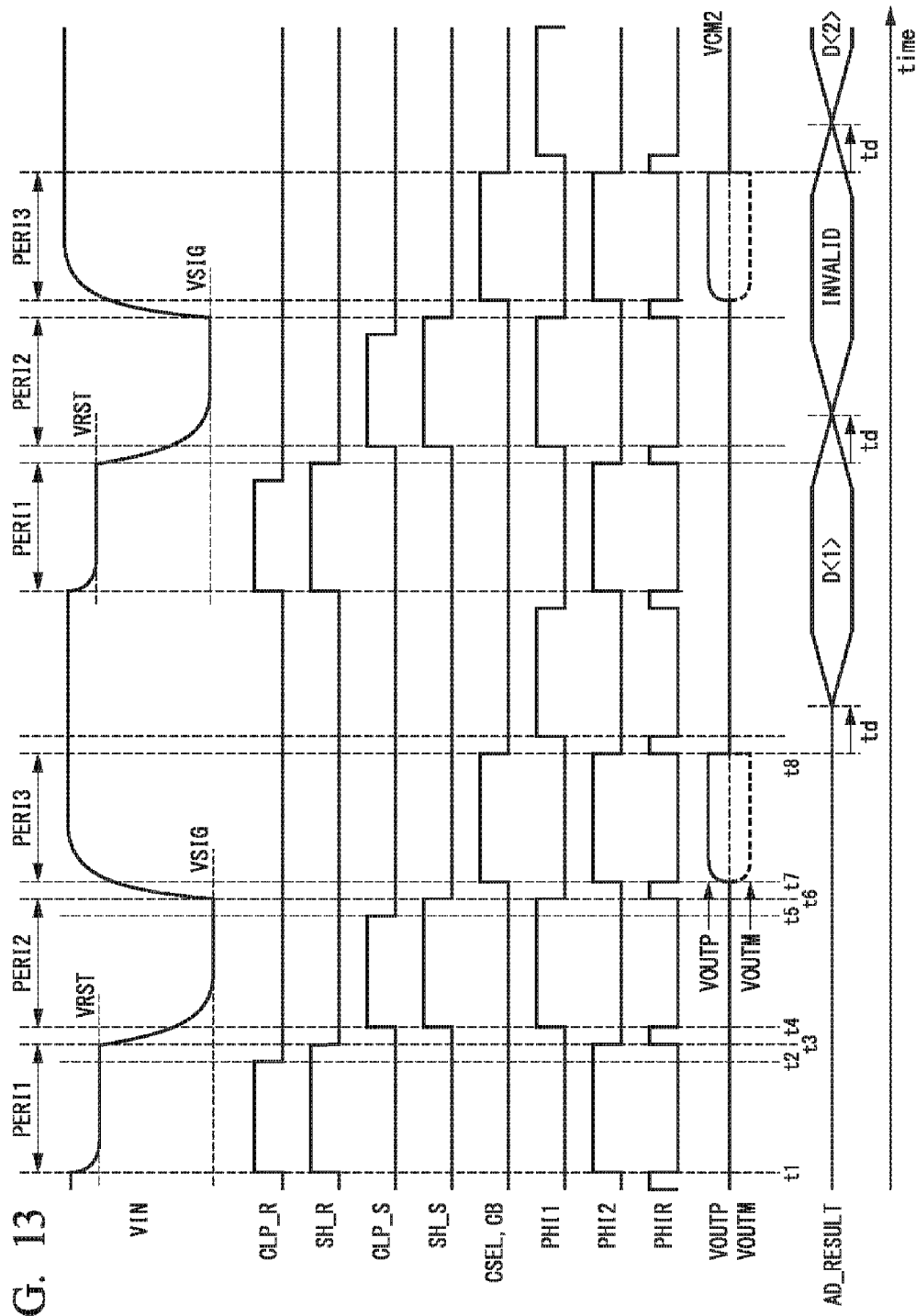
FIG. 13 is a timing chart describing an operation of the semiconductor device of the third embodiment of the present invention.

An operation of the semiconductor device APTSb will be described with reference to FIGS. 12 and 13. FIG. 13 shows the operation of the semiconductor device APTSb. FIG. 13 shows a waveform of the input signal VIN, waveforms of the control signals CLP_R, SH_R, CLP_S, SH_S, CSEL, CB, PHI1, PHI2, and PHIR, a waveform of the positive output signal VOUTP, a waveform of the negative output signal VOUTM, and a state of an AD converted result AD_RESULT. A horizontal direction of FIG. 13 indicates time. A vertical direction of FIG. 13 indicates a voltage.

At time t1, the control signal CLP_R and the control signal SH_R simultaneously become an H level so that a first period PERI1 is started. In the first period PERI1 a level of the input signal VIN is a first signal level VRST. For this reason, an electric charge according to the first signal level VRST is sampled in the first sub-sampling capacitance CS_R. In other words, the first sub-sampling capacitance CS_R holds the first signal level VRST of the input signal VIN in the first period PERI1. A final amount of electric charge of the first sub-sampling capacitance CS_R is determined when the control signal CLP_R transitions to an L level (time t2). At time t3, the control signal SH_R transitions to an L level, and thus the first period PERI1 ends.

The control signal PHIR has an H level from time t3 to time t4. Thus, electric charges which are present on the input terminal sides of the first operational amplifier OTA1 and the second operational amplifier OTA2 are reset. Such an operation is a reset operation which is repeatedly performed between a timing at which the control signal PHI1 or the control signal PHI2 transitions from an H level to an L level and a timing at which the control signal PHI2 or the control signal PHI1 transitions from an L level to an H level. A description of a reset operation will be omitted.

At time t4, the control signal CLP_S and the control signal SH_S simultaneously become an H level so that a second period PERI2 is started. In the second period PERI2, a level of the input signal VIN is a second signal level VSIG. For this reason, an electric charge according to the second signal level VSIG is sampled in the second sub-sampling capacitance CS_S. In other words, the second sub-sampling capacitance CS_S holds the second signal level VSIG of the input signal VIN in the second period PERI2. A final amount of electric charge of the second sub-sampling capacitance CS_S is determined when the control signal CLP_S transitions to an L level (time t5). At time t6, the control signal SH_S transitions to an L level, and thus the second period PERI2 ends.

At time t7, the control signal CSEL, the control signal CB, and the control signal PHI2 transition to an H level so that a third period PERI3 is started. At time t8, the control signal CSEL, the control signal CB, and the control signal PHI2 transition to an L level, and thus the third period PERI3 ends. In the third period PERI3, a signal is amplified by the first variable gain amplifier PGA1$b$. During this period, a circuit configuration of the first variable gain amplifier PGA1$b$ is the same as the circuit configuration of the first variable gain amplifier PGA1$a$ according to the second embodiment. A gain of the first variable gain amplifier PGA1$b$ is G1=Cs1/Cf1. The single-pole single-throw switch SW43 is short-circuited so that subtraction of signals due to electric charges accumulated in the first sub-sampling capacitance CS_R and the second sub-sampling capacitance CS_S is performed. In other words, the first variable gain amplifier PGA1$b$ outputs a difference between the first signal level VRST and the second signal level VSIG in the third period PERI3. For this reason, a final output signal of the semiconductor device APTSb is obtained by Expression (7).

$$\text{VOUTP}-\text{VOUTM}=(Cs1/Cf1)\times(\text{VRST}-\text{VSIG}) \quad (7)$$

In Expression (7), VAST is a first signal level VRST, and VSIG is a second signal level VSIG. In Expression (7), other reference symbols are the same as the reference symbols in Expression (5).

Expression (7) is right when a gain G is 1 or less. When the gain G is higher than 1, amplification is performed by the first variable gain amplifier PGA1$b$ and the second variable gain amplifier PGA2$a$. For this reason, a final output signal of the semiconductor device APTSb is obtained by Expression (8).

$$\text{VOUTP}-\text{VOUTM}=(Cs1/Cf1)\times(Cs2/Cf2)\times(\text{VRST}-\text{VSIG}) \quad (8)$$

In Expression (8), reference symbols are the same as the reference symbols of Expression (5) and Expression (7).

A signal which is input to the second variable gain amplifier PGA2$a$ in the third embodiment is the same as the signal which is input to the second variable gain amplifier PGA2$a$ in the second embodiment. The second variable gain amplifier PGA2$a$ operates with a principle which is the same as a principle of the operation of the first variable gain amplifier PGA1$b$. For this reason, a detailed description of the operation of the second variable gain amplifier PGA2$a$ will be omitted.

(Sixth Advantage)

The semiconductor device APTSb can perform a subtraction process with a relatively simple configuration. For example, the semiconductor device APTSb is used as an amplifier circuit of a sensor configured to output a predetermined offset voltage as the first signal level VAST and output a sum of the predetermined offset voltage and a predetermined signal level as the second signal level VSIG. In this case, only a predetermined signal level excluding an offset voltage can be amplified. For this reason, an advantage in which a dynamic range expands is obtained.

Fourth Embodiment

A fourth embodiment of the present invention will be described.

(Configuration)

Figure 14:
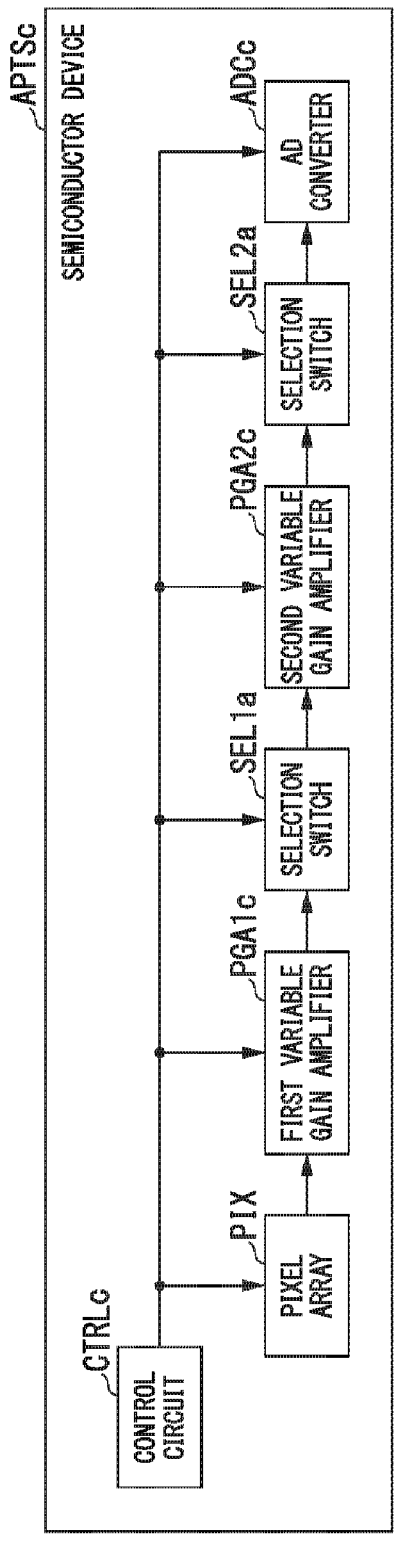
FIG. 14 is a block diagram showing a configuration of a semiconductor device according to a fourth embodiment of the present invention.

A configuration of a semiconductor device APTSc according to the fourth embodiment will be described using FIGS. 14 to 16. FIG. 14 shows the configuration of the semiconductor device APTSc. As shown in FIG. 14, the semiconductor device APTSc includes a pixel array PIX, a first variable gain amplifier PGA1$c$, a second variable gain amplifier PGA2$c$, a selection switch SEL1$a$, a selection switch SEL2$a$, an AD converter ADCc, and a control circuit CTRLc. A configuration of the selection switch SEL1$a$ and the selection switch SEL2$a$ is the same as the configuration in the second embodiment. For this reason, a description of the configuration of the selection switch SEL1$a$ and the selection switch SEL2$a$ will be omitted.

Figure 15:
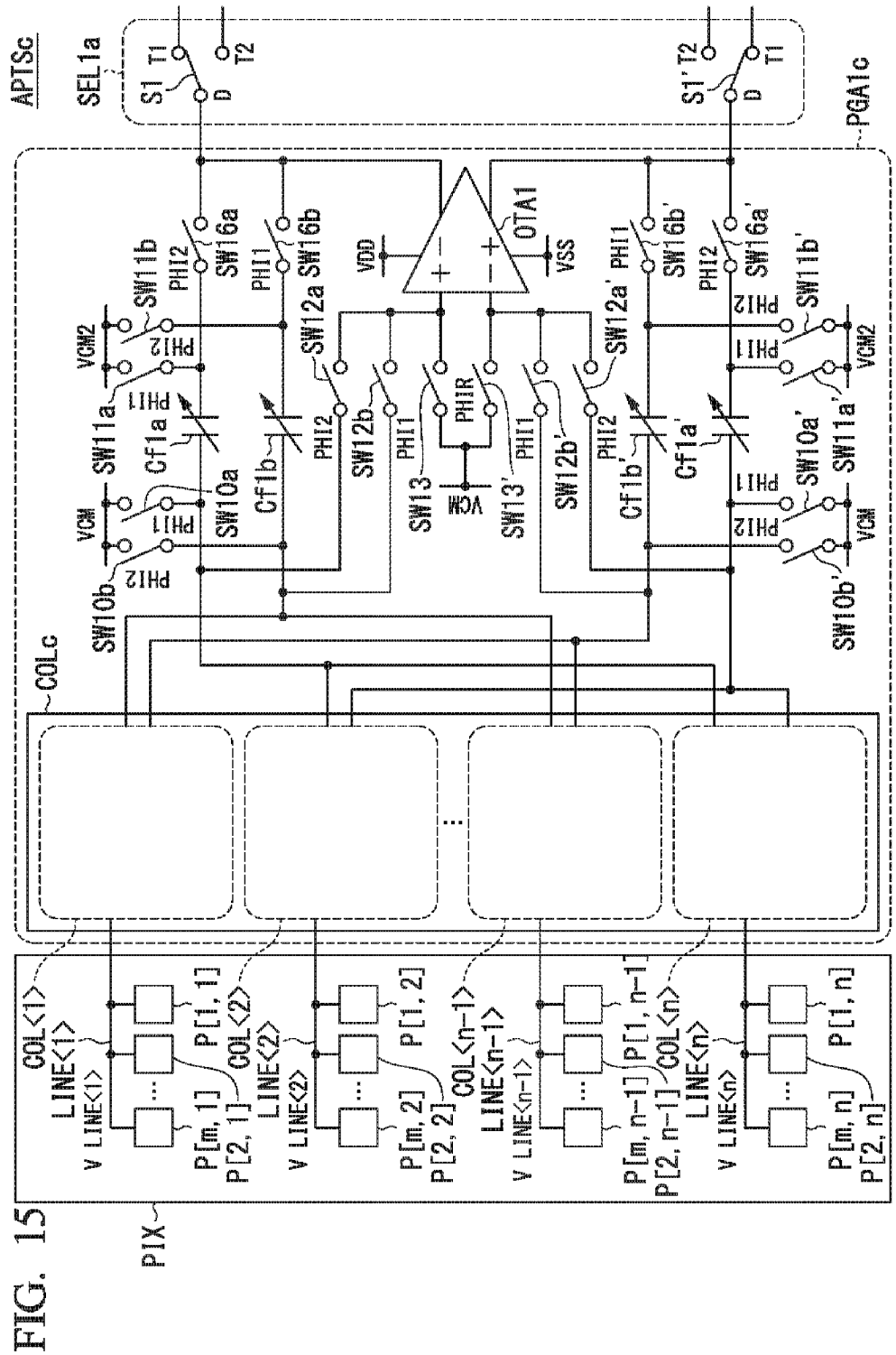
FIG. 15 is a circuit diagram showing a configuration of the semiconductor device according to the fourth embodiment of the present invention.
Figure 16:
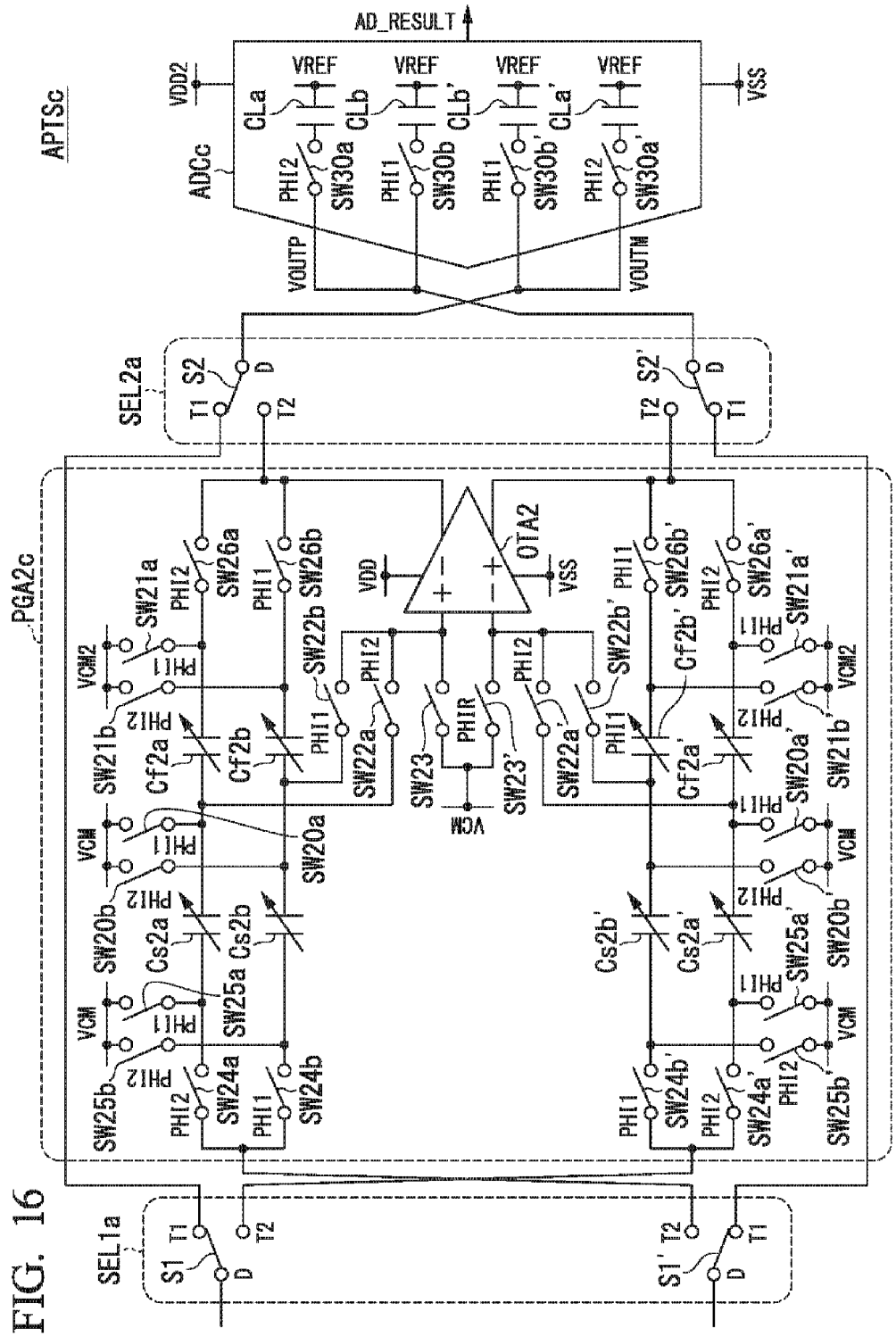
FIG. 16 is a circuit diagram showing a configuration of the semiconductor device according to the fourth embodiment of the present invention.

FIGS. 15 and 16 show detailed configurations of the semiconductor device APTSc. FIG. 15 shows a configuration of the pixel array PIX, the first variable gain amplifier PGA1$c$, and the selection switch SEL1$a$. FIG. 16 shows a configuration of the second variable gain amplifier PGA2$c$, the selection switch SEL1$a$, the selection switch SEL2$a$, and the AD converter ADCc. All blocks constituting the semiconductor device APTSc are arranged in the same semiconductor substrate.

(Pixel Array PIX)

The pixel array PIX has a plurality of (that is, m×n) pixels P[k,l]. Numbers m and n are natural numbers of 2 or more. Number k is a natural number which is greater than or equal to 1 and less than or equal to m. Number l is a natural number which is greater than or equal to 1 and less than or equal to n. The plurality of pixels p[k,l] are arranged in a matrix form. Number k is a row number, and l is a column number. In FIG. 15, for convenience of illustration, a horizontal direction on the paper surface is a column direction, and a vertical direction thereon is a row direction. The plurality of pixels p[k, l] are controlled using control signals RSEL<1> to RSEL<m> (not shown). A plurality of (that is, n) vertical signal lines LINE<1> to LINE<n> are arranged to correspond to columns of the plurality of pixels p[k,l]. Only pixels P[k,l] of a row in which the control signal RSEL<k> has an H level are connected to one of the plurality of vertical signal lines LINE<1> to LINE<n>. When light is incident on a plurality of pixels P[k,l], the plurality of pixels P[k,l] output analog signals V_LINE<1> to V_LINE<n> according to the incident light to the plurality of vertical signal lines LINE<1> to LINE<n>.

(First Variable Gain Amplifier PGA1$c$)

The first variable gain amplifier PGA1$c$ includes a column circuit COLc, single-pole single-throw switches SW10$a$ to SW12$a$, single-pole single-throw switches SW10$a'$ to SW12$a'$, single-pole single-throw switches SW10$b$ to SW12$b$, single-pole single-throw switches SW10$b'$ to SW12$b'$, a single-pole single-throw switch SW13, a single-pole single-throw switch SW13', a single-pole single-throw switch SW16$a$, a single-pole single-throw switch SW16$a'$, a single-pole single-throw switch SW16$b$, a single-pole single-throw switch SW16$b'$, a first feedback capacitance Cf1$a$, a first feedback capacitance Cf1$a'$, a first feedback capacitance Cf1b, a first feedback capacitance Cf1b', and a first operational amplifier OTA1.

The column circuit COLc includes a plurality of (that is, n) column circuits COL<1> to COL<n>. The plurality of column circuits COL<1> to COL<n> are arranged to correspond to columns of a plurality of pixels P[k, l]. A configuration of the plurality of column circuits COL<1> to COL<n> is the same as the configuration of the column circuits COL in the third embodiment. In FIG. 15, for convenience of illustration, the configuration of the plurality of column circuits COLM<1> to COL<n> will be omitted.

In each column circuit COL<1>, a control signal CSEL<1> is input to a single-pole single-throw switch SW42 and a single-pole single-throw switch SW42'. Furthermore, in each column circuit COL<1>, a control signal CB<1> is input to a single-pole single-throw switch SW43. Therefore, the column circuit COL<1> can be independently controlled for each column. Switches included in the column circuits COL<1> are controlled using a control signal SH_R, a control signal SH_S, a control signal CLP_R, a control signal CLP_S, a control signal CB<1>, and a control signal CSEL<1>. Each of the switches is short-circuited when a control signal which is input to the switch has an H level. Each of the switches is opened when a control signal which is input to the switch has an L level.

Each of the first feedback capacitance Cf1a and the first feedback capacitance Cf1a' includes a first terminal and a second terminal. The first terminal of the first feedback capacitance Cf1a is connected to second terminals of single-pole single-throw switches SW42 of column circuits of an even column COL<2>, COL<4>, and the like. The first terminal of the first feedback capacitance Cf1a' is connected to second terminals of single-pole single-throw switches SW42' of the column circuits of the even column COL<2>, COL<4>, and the like. The first feedback capacitance Cf1a and the first feedback capacitance Cf1a' are variable capacitances.

Each of the first feedback capacitance Cf1b and the first feedback capacitance Cf1b' includes a first terminal and a second terminal. The first terminal of the first feedback capacitance Cf1b is connected to second terminals of single-pole single-throw switches SW42 of column circuits of an odd column COL<1>, COL<3>, and the like. The first terminal of the first feedback capacitance Cf1b' is connected to second terminals of single-pole single-throw switches SW42' of the column circuits of the odd column COL<1>, COL<3>, and the like. The first feedback capacitance Cf1b and the first feedback capacitance Cf1b' are variable capacitances.

Each of the single-pole single-throw switch SW10a and the single-pole single-throw switch SW11a includes a first terminal and a second terminal. The first terminal of the single-pole single-throw switch SW10a is connected to the second terminals of the single-pole single-throw switches SW42 of the column circuits of the even column COL<2>, COL<4>, and the like. A first common mode voltage VCM is input to the second terminal of the single-pole single-throw switch SW10a. The first terminal of the single-pole single-throw switch SW11a is connected to the second terminal of the first feedback capacitance Cf1a. A second common mode voltage VCM2 is input to the second terminal of the single-pole single-throw switch SW11a.

Each of the single-pole single-throw switches SW10a' and the single-pole single-throw switch SW11a' includes a first terminal and a second terminal. The first terminal of the single-pole single-throw switches SW10a' is connected to the second terminals of the single-pole single-throw switch SW42' of the column circuits of the even column COL<2>, COL<4>, and the like. A first common mode voltage VCM is input to the second terminal of the single-pole single-throw switch SW10a'. The first terminal of the single-pole single-throw switch SW11a' is connected to the second terminal of the first feedback capacitance Cf1a'. The second common mode voltage VCM2 is input to the second terminal of the single-pole single-throw switch SW11a'.

Each of the single-pole single-throw switches SW10b and the single-pole single-throw switch SW11b includes a first terminal and a second terminal. The first terminal of the single-pole single-throw switches SW10b is connected to the second terminals of the single-pole single-throw switches SW42 of the column circuits of the odd column COL<1>, COL<3>, and the like. The first common mode voltage VCM is input to the second terminal of the single-pole single-throw switch SW10b. The first terminal of the single-pole single-throw switch SW11b is connected to the second terminal of the first feedback capacitance Cf1b. The second common mode voltage VCM2 is input to the second terminal of the single-pole single-throw switch SW11b.

Each of the single-pole single-throw switches SW10b' and the single-pole single-throw switch SW11b' includes a first terminal and a second terminal. The first terminal of the single-pole single-throw switches SW10b' is connected to the second terminals of the single-pole single-throw switches SW42' of the column circuits of the odd column COL<1>, COL<3>, and the like. The first common mode voltage VCM is input to the second terminal of the single-pole single-throw switch SW10b'. The first terminal of the single-pole single-throw switch SW11b' is connected to the second terminal of the first feedback capacitance Cf1b'. The second common mode voltage VCM2 is input to the second terminal of the single-pole single-throw switch SW11b'.

Each of the single-pole single-throw switch SW12a, the single-pole single-throw switch SW12b, and the single-pole single-throw switch SW13 includes a first terminal and a second terminal. The first terminal of the single-pole single-throw switch SW12a is connected to the second terminals of the single-pole single-throw switches SW42 of the column circuits of the even column COL<2>, COL<4>, and the like. The first terminal of the single-pole single-throw switch SW12b is connected to the second terminals of the single-pole single-throw switches SW42 of the column circuits of the odd column COL<1>, COL<3>, and the like. The first terminal of the single-pole single-throw switch SW13 is connected to the second terminal of the single-pole single-throw switch SW12a and the second terminal of the single-pole single-throw switch SW12b. The first common mode voltage VCM is input to the second terminal of the single-pole single-throw switch SW13.

Each of the single-pole single-throw switch SW12a', the single-pole single-throw switch SW12b', and the single-pole single-throw switch SW13' includes a first terminal and a second terminal. The first terminal of the single-pole single-throw switch SW12a' is connected to the second terminals of the single-pole single-throw switches SW42' of the column circuits of the even column COL<2>, COL<4>, and the like. The first terminal of the single-pole single-throw switch SW12b' is connected to the second terminals of the single-pole single-throw switches SW42' of the column circuits of the odd column COL<1>, COL<3>, and the like. The first terminal of the single-pole single-throw switch SW13' is connected to the second terminal of the single-pole single-throw switch SW12a' and the second terminal of the single-pole single-throw switch SW12b'. The first common mode voltage VCM is input to the second terminal of the single-pole single-throw switch SW13'.

Each of the single-pole single-throw switch SW16a and the single-pole single-throw switch SW16b includes a first terminal and a second terminal. The first terminal of the single-pole single-throw switch SW16a is connected to the second terminal of the first feedback capacitance Cf1a. The first terminal of the single-pole single-throw switch SW16b is connected to the second terminal of the first feedback capacitance Cf1b.

Each of the single-pole single-throw switch SW16a' and the single-pole single-throw switch SW16b' includes a first terminal and a second terminal. The first terminal of the single-pole single-throw switch SW16a' is connected to the second terminal of the first feedback capacitance Cf1a'. The first terminal of the single-pole single-throw switch SW16b' is connected to the second terminal of the first feedback capacitance Cf1b'.

The first operational amplifier OTA1 includes a first positive input terminal (a first input terminal), a first negative input terminal (a first input terminal), a first positive output terminal (a first output terminal), and a first negative output terminal (a first output terminal). The first positive input terminal of the first operational amplifier OTA1 is a non-inverting input terminal, and the first negative input terminal of the first operational amplifier OTA1 is an inverting input terminal. The first positive input terminal of the first operational amplifier OTA1 is connected to the second terminal of the single-pole single-throw switch SW12a, the second terminal of the single-pole single-throw switch SW12b, and the first terminal of the single-pole single-throw switch SW13. The first negative input terminal of the first operational amplifier OTA1 is connected to the second terminal of the single-pole single-throw switch SW12a', the second terminal of the single-pole single-throw switch SW12b', and the first terminal of the single-pole single-throw switch SW13'. The first positive output terminal of the first operational amplifier OTA1 is connected to the second terminal of the single-pole single-throw switch SW16a' and the second terminal of the single-pole single-throw switch SW16b'. The first negative output terminal of the first operational amplifier OTA1 is connected to the second terminal of the single-pole single-throw switch SW16a and the second terminal of the single-pole single-throw switch SW16b. The first operational amplifier OTA1 includes two power supply terminals, and a power supply voltage VDD and a power supply voltage VSS are input to the two power supply terminals.

Signals which are output from the column circuits of the even column COL<2>, COL<4>, and the like are each amplified at a timing at which a control signal PHI2 has an H level. Signals which are output from the column circuits of the odd column COL<1>, COL<3>, and the like are each amplified at a timing at which a control signal PHI1 has an H level.

In the first variable gain amplifier PGA1a described in the second embodiment, the first operational amplifier OTA1 amplifies a signal during the SAMP & AMPL period shown in FIG. 10. However, in the first variable gain amplifier PGA1a described in the second embodiment, the first operational amplifier OTA1 does not amplify a signal during a NULL period.

In the first variable gain amplifier PGA1c according to the fourth embodiment, two overlapping passive element groups are provided for one first operational amplifier OTA1. The two passive element groups include constituent elements in which a is included in reference symbols thereof (the single-pole single-throw switch SW10a and the like) and constituent elements in which b is included in reference symbols thereof (the single-pole single-throw switch SW10b and the like). The two passive element groups are connected to the first operational amplifier OTA1 at a timing at which the two passive element groups are complementary to each other. In other words, the first variable gain amplifier PGA1c is controlled so that any one of the two passive element groups operates in the SAMP & AMPL period using the control signal PHI2 and the control signal PHI1 which become an H level at a complementary timing (an interleave operation). Thus, since use efficiency of the first operational amplifier OTA1 increases, a lower power consumption operation is realized. A detailed operation will be described below using FIG. 17.

(Second Variable Gain Amplifier PGA2c)

The second variable gain amplifier PGA2c includes single-pole single-throw switches SW20a to SW22a, single-pole single-throw switches SW20a' to SW22a', single-pole single-throw switches SW20b to SW22b, single-pole single-throw switches SW20b' to SW22b', a single-pole single-throw switch SW23, a single-pole single-throw switch SW23', single-pole single-throw switches SW24a to SW26a, single-pole single-throw switches SW24a' to SW26a', single-pole single-throw switches SW24b to SW26b, single-pole single-throw switches SW24b' to SW26b', a second sampling capacitance Cs2a, a second sampling capacitance Cs2a', a second sampling capacitance Cs2b, a second sampling capacitance Cs2b', a second feedback capacitance Cf2a, a second feedback capacitance Cf2a', a second feedback capacitance Cf2b, a second feedback capacitance Cf2b', and a second operational amplifier OTA2.

Each of the single-pole single-throw switch SW24a and the single-pole single-throw switch SW25a includes a first terminal and a second terminal. The first terminal of the single-pole single-throw switch SW24a is connected to the second terminal T2 of the single-pole double-throw switch S1'. The first terminal of the single-pole single-throw switch SW25a is connected to the second terminal of the single-pole single-throw switch SW24a. The first common mode voltage VCM is input to the second terminal of the single-pole single-throw switch SW25a.

Each of the single-pole single-throw switch SW24a' and the single-pole single-throw switch SW25a' includes a first terminal and a second terminal. The first terminal of the single-pole single-throw switch SW24a' is connected to the second terminal T2 of the single-pole double-throw switch S1. The first terminal of the single-pole single-throw switch SW25a' is connected to the second terminal of the single-pole single-throw switch SW24a'. The first common mode voltage VCM is input to the second terminal of the single-pole single-throw switch SW25a'.

Each of the single-pole single-throw switch SW24b and the single-pole single-throw switch SW25b includes a first terminal and a second terminal. The first terminal of the single-pole single-throw switch SW24b is connected to the second terminal T2 of the single-pole double-throw switch S1'. The first terminal of the single-pole single-throw switch SW25b is connected to the second terminal of the single-pole single-throw switch SW24b. The first common mode voltage VCM is input to the second terminal of the single-pole single-throw switch SW25b.

Each of the single-pole single-throw switch SW24b' and the single-pole single-throw switch SW25b' includes a first terminal and a second terminal. The first terminal of the single-pole single-throw switch SW24b' is connected to the second terminal T2 of the single-pole double-throw switch S1. The first terminal of the single-pole single-throw switch SW25*b*' is connected to the second terminal of the single-pole single-throw switch SW24*b*'. The first common mode voltage VCM is input to the second terminal of the single-pole single-throw switch SW25*b*'.

Each of the second sampling capacitance Cs2*a* and the second sampling capacitance Cs2*a*' includes a first terminal and a second terminal. The first terminal of the second sampling capacitance Cs2*a* is connected to the second terminal of the single-pole single-throw switch SW24*a*. The first terminal of the second sampling capacitance Cs2*a*' is connected to the second terminal of the single-pole single-throw switch SW24*a*'. The second sampling capacitance Cs2*a* and the second sampling capacitance Cs2*a*' are variable capacitances.

Each of the second sampling capacitance Cs2*b* and the second sampling capacitance Cs2*b*' includes a first terminal and a second terminal. The first terminal of the second sampling capacitance Cs2*b* is connected to the second terminal of the single-pole single-throw switch SW24*b*. The first terminal of the second sampling capacitance Cs2*b*' is connected to the second terminal of the single-pole single-throw switch SW24*b*'. The second sampling capacitance Cs2*b* and the second sampling capacitance Cs2*b*' are variable capacitances.

Each of the second feedback capacitance Cf2*a* and the second feedback capacitance Cf2*a*' includes a first terminal and a second terminal. The first terminal of the second feedback capacitance Cf2*a* is connected to the second terminal of the second sampling capacitance Cs2*a*. The first terminal of the second feedback capacitance Cf2*a*' is connected to the second terminal of the second sampling capacitance Cs2*a*'. The second feedback capacitance Cf2*a* and the second feedback capacitance Cf2*a*' are variable capacitances.

Each of the second feedback capacitance Cf2*b* and the second feedback capacitance Cf2*b*' includes a first terminal and a second terminal. The first terminal of the second feedback capacitance Cf2*b* is connected to the second terminal of the second sampling capacitance Cs2*b*. The first terminal of the second feedback capacitance Cf2*b*' is connected to the second terminal of the second sampling capacitance Cs2*b*'. The second feedback capacitance Cf2*b* and the second feedback capacitance Cf2*b*' are variable capacitances.

Each of the single-pole single-throw switch SW20*a* and the single-pole single-throw switch SW21*a* includes a first terminal and a second terminal. The first terminal of the single-pole single-throw switch SW20*a* is connected to the second terminal of the second sampling capacitance Cs26*a*. The first common mode voltage VCM is input to the second terminal of the single-pole single-throw switch SW20*a*. The first terminal of the single-pole single-throw switch SW21*a* is connected to the second terminal of the second feedback capacitance Cf2*a*. The second common mode voltage VCM2 is input to the second terminal of the single-pole single-throw switch SW21*a*.

Each of the single-pole single-throw switch SW20*a*' and the single-pole single-throw switch SW21*a*' includes a first terminal and a second terminal. The first terminal of the single-pole single-throw switch SW20*a*' is connected to the second terminal of the second sampling capacitance Cs2*a*'. The first common mode voltage VCM is input to the second terminal of the single-pole single-throw switch SW20*a*'. The first terminal of the single-pole single-throw switch SW21*a*' is connected to the second terminal of the second feedback capacitance Cf2*a*'. The second common mode voltage VCM2 is input to the second terminal of the single-pole single-throw switch SW21*a*'.

Each of the single-pole single-throw switch SW20*b* and the single-pole single-throw switch SW21*b* includes a first terminal and a second terminal. The first terminal of the single-pole single-throw switch SW20*b* is connected to the second terminal of the second sampling capacitance Cs2*b*. The first common mode voltage VCM is input to the second terminal of the single-pole single-throw switch SW20*b*. The first terminal of the single-pole single-throw switch SW21*b* is connected to the second terminal of the second feedback capacitance Cf2*b*. The second common mode voltage VCM2 is input to the second terminal of the single-pole single-throw switch SW21*b*.

Each of the single-pole single-throw switch SW20*b*' and the single-pole single-throw switch SW21*b*' includes a first terminal and a second terminal. The first terminal of the single-pole single-throw switch SW20*b*' is connected to the second terminal of the second sampling capacitance Cs2*b*'. The first common mode voltage VCM is input to the second terminal of the single-pole single-throw switch SW20*b*'. The first terminal of the single-pole single-throw switch SW21*b*' is connected to the second terminal of the second feedback capacitance Cf2*b*'. The second common mode voltage VCM2 is input to the second terminal of the single-pole single-throw switch SW21*b*'.

Each of the single-pole single-throw switch SW22*a*, the single-pole single-throw switch SW22*b*, and the single-pole single-throw switch SW23 includes a first terminal and a second terminal. The first terminal of the single-pole single-throw switch SW22*a* is connected to the second terminal of the second sampling capacitance Cs2*a*. The first terminal of the single-pole single-throw switch SW22*b* is connected to the second terminal of the second sampling capacitance Cs2*b*. The first terminal of the single-pole single-throw switch SW23 is connected to the second terminal of the single-pole single-throw switch SW22*a* and the second terminal of the single-pole single-throw switch SW22*b*. The first common mode voltage VCM is input to the second terminal of the single-pole single-throw switch SW23.

Each of the single-pole single-throw switch SW22*a*', the single-pole single-throw switch SW22*b*', and the single-pole single-throw switch SW23' includes a first terminal and a second terminal. The first terminal of the single-pole single-throw switch SW22*a*' is connected to the second terminal of the second sampling capacitance Cs2*a*'. The first terminal of the single-pole single-throw switch SW22*b*' is connected to the second terminal of the second sampling capacitance Cs2*b*'. The first terminal of the single-pole single-throw switch SW23' is connected to the second terminal of the single-pole single-throw switch SW22*a*' and the second terminal of the single-pole single-throw switch SW22*b*'. The first common mode voltage VCM is input to the second terminal of the single-pole single-throw switch SW23'.

Each of the single-pole single-throw switch SW26*a* and the single-pole single-throw switch SW26*b* includes a first terminal and a second terminal. The first terminal of the single-pole single-throw switch SW26*a* is connected to the second terminal of the second feedback capacitance Cf2*a*. The first terminal of the single-pole single-throw switch SW26*b* is connected to the second terminal of the second feedback capacitance Cf2*b*.

Each of the single-pole single-throw switch SW26*a*' and the single-pole single-throw switch SW26*b*' includes a first terminal and a second terminal. The first terminal of the single-pole single-throw switch SW26*a*' is connected to the second terminal of the second feedback capacitance Cf2a'. The first terminal of the single-pole single-throw switch SW26b' is connected to the second terminal of the second feedback capacitance Cf2b'.

The second operational amplifier OTA2 includes a second positive input terminal (a second input terminal), a second negative input terminal (a second input terminal), a second positive output terminal (a second output terminal), and a second negative output terminal (a second output terminal). The second positive input terminal of the second operational amplifier OTA2 is a non-inverting input terminal, and the second negative input terminal of the second operational amplifier OTA2 is an inverting input terminal. The second positive input terminal of the second operational amplifier OTA2 is connected to the second terminal of the single-pole single-throw switch SW22a, the second terminal of the single-pole single-throw switch SW22b, and the first terminal of the single-pole single-throw switch SW23. The second negative input terminal of the second operational amplifier OTA2 is connected to the second terminal of the single-pole single-throw switch SW22a', the second terminal of the single-pole single-throw switch SW22b', and the first terminal of the single-pole single-throw switch SW23'. The second positive output terminal of the second operational amplifier OTA2 is connected to the second terminal of the single-pole single-throw switch SW26a' and the second terminal of the single-pole single-throw switch SW26b'. The second negative output terminal of the second operational amplifier OTA2 is connected to the second terminal of the single-pole single-throw switch SW26a and the second terminal of the single-pole single-throw switch SW26b. The second operational amplifier OTA2 includes two power supply terminals, and the power supply voltage VDD and the power supply voltage VSS are input to the two power supply terminals.

In the second variable gain amplifier PGA2c according to the fourth embodiment, two overlapping passive element groups are provided for one second operational amplifier OTA2. The two passive element groups include constituent elements in which a is included in reference symbols thereof (the single-pole single-throw switch SW20a and the like) and constituent elements in which b is included in reference symbols thereof (the single-pole single-throw switch SW20b and the like). An interleave operation of the two passive element groups is performed like in the first variable gain amplifier PGA1c.

(AD Converter ADCc)

An AD converter ADCc includes a single-pole single-throw switch SW30a, a single-pole single-throw switch SW30a', a single-pole single-throw switch SW30b, a single-pole single-throw switch SW30b', a load capacitance CLa, a load capacitance CLa', a load capacitance CLb, and a load capacitance CLb'.

Each of the single-pole single-throw switch SW30a and the single-pole single-throw switch SW30a' includes a first terminal and a second terminal. The first terminal of the single-pole single-throw switch SW30a is connected to the third terminal D of the single-pole double-throw switch S2'. The first terminal of the single-pole single-throw switch SW30a' is connected to the third terminal D of the single-pole double-throw switch S2.

Each of the single-pole single-throw switch SW30b and the single-pole single-throw switch SW30b' includes a first terminal and a second terminal. The first terminal of the single-pole single-throw switch SW30b is connected to the third terminal D of the single-pole double-throw switch S2'. The first terminal of the single-pole single-throw switch SW30b' is connected to the third terminal D of the single-pole double-throw switch S2.

Each of the load capacitance CLa and the load capacitance CLa' includes a first terminal and a second terminal. The first terminal of the load capacitance CLa is connected to the second terminal of the single-pole single-throw switch SW30a. A reference voltage VREF is input to the second terminal of the load capacitance CLa. The first terminal of the load capacitance CLa' is connected to the second terminal of the single-pole single-throw switch SW30a'. The reference voltage VREF is input to the second terminal of the load capacitance CLa'. The load capacitance CLa and the load capacitance CLa' are sampling capacitances configured to sample signals.

Each of the load capacitance CLb and the load capacitance CLb' includes a first terminal and a second terminal. The first terminal of the load capacitance CLb is connected to the second terminal of the single-pole single-throw switch SW30b. The reference voltage VREF is input to the second terminal of the load capacitance CLb. The first terminal of the load capacitance CLb' is connected to the second terminal of the single-pole single-throw switch SW30b'. The reference voltage VREF is input to the second terminal of the load capacitance CLb'. The load capacitance CLb and the load capacitance CLb' are sampling capacitances configured to sample signals.

In the AD converter ADCc, a configuration other than the configuration shown in FIG. 16 will be omitted. The AD converter ADCc is a load circuit including capacitive loads (the load capacitance CLa, the load capacitance CLa', the load capacitance CLb, and the load capacitance CLb'). The AD converter ADCc converts a positive output signal VOUTP and a negative output signal VOUTM into digital signals. The AD converter ADCc outputs the digital signals as AD converted results AD_RESULT.

Switches included in the AD converter ADCc are controlled by the control signal PHI1 and the control signal PHI2. Each of the switches is short-circuited when a control signal input to the switch has an H level. Each of the switches is opened when a control signal input to the switch has an L level. The load capacitance CLb and the load capacitance CLb' are in a sampling mode in a period in which the control signal PHI1 has an H level. At this time, the load capacitance CLb and the load capacitance CLb' follow a voltage of a signal which is output from the first variable gain amplifier PGA1c or the second variable gain amplifier PGA2c. A voltage at a timing at which the control signal PHI1 transitions to an L level is held in the load capacitance CLb and the load capacitance CLb'. At this time, the AD converter ADCc starts AD conversion. After a predetermined time td has elapsed, the AD converter ADCc outputs (updates) the AD converted result AD_RESULT.

Similarly, the load capacitance CLa and the load capacitance CLa' are in a sampling mode in a period in which the control signal PHI2 has an H level. At this time, the load capacitance CLa and the load capacitance CLa' follow a voltage of a signal which is output from the first variable gain amplifier PGA1c or the second variable gain amplifier PGA2c. A voltage at a timing at which the control signal PHI2 transitions to an L level is held in the load capacitance CLa and the load capacitance CLa'. At this time, the AD converter ADCc starts AD conversion. After a predetermined time td has elapsed, the AD converter ADCc outputs (updates) the AD converted result AD_RESULT.

(Control Circuit CTRLc)

The control circuit CTRLc controls the pixel array PIX, the first variable gain amplifier PGA1c, the second variable gain amplifier PGA2c, the selection switch SEL1a, the selection switch SEL2a, and the AD converter ADCc.

The control circuit CTRLc outputs the control signals PHI1 PHI2, PHIR, CLP_R, SH_R, CLP_S, SH_S, CSEL<1>, CB<1>, and RSEL<k> to the above-described blocks. The control circuit CTRLc controls capacitance values of the second sampling capacitances Cs2a, Cs2b, Cs2a', and Cs2b' using control signals (not shown) to be inversely proportional to a gain G1 of the first variable gain amplifier PGA1c. The details of such control will be described below.

As described above, the semiconductor device APTSc includes the pixel array PIX in which the plurality of pixels P[k,l] configured to generate the first voltage signal in accordance with incident light are arranged in a matrix form. A plurality of first sampling capacitances Cs1 corresponding to a plurality of columns of the pixel array PIX are arranged. A plurality of first sub-sampling capacitances CS_R simultaneously hold first signal levels of a plurality of columns in a first period. A plurality of second sub-sampling capacitances CS_S simultaneously hold second signal levels of a plurality of columns in a second period. The first variable gain amplifier PGA1c sequentially outputs differences between the first signal levels and the second signal levels of the plurality of columns in a third period.

Capacitance values of the second sampling capacitances Cs2a, Cs2b, Cs2a', and Cs2b' are set to be inversely proportional to the gain G1 of the first variable gain amplifier PGA1c. In other words, capacitance values are set so that products of the capacitance values of the second sampling capacitances Cs2a, Cs2b, Cs2a', and Cs2b' and the gain G1 of the first variable gain amplifier PGA1c are constant.

A load circuit of the semiconductor device APTSc is the AD converter ADCc including the sampling capacitances (the load capacitances CLa, CLa', CLb, and CLb'). The first variable gain amplifier PGA1c, the second variable gain amplifier PGA2c, the selection switch SEL1a, SEL2a, and the load circuit are arranged in the same semiconductor substrate.

(Operation)

Figure 17:
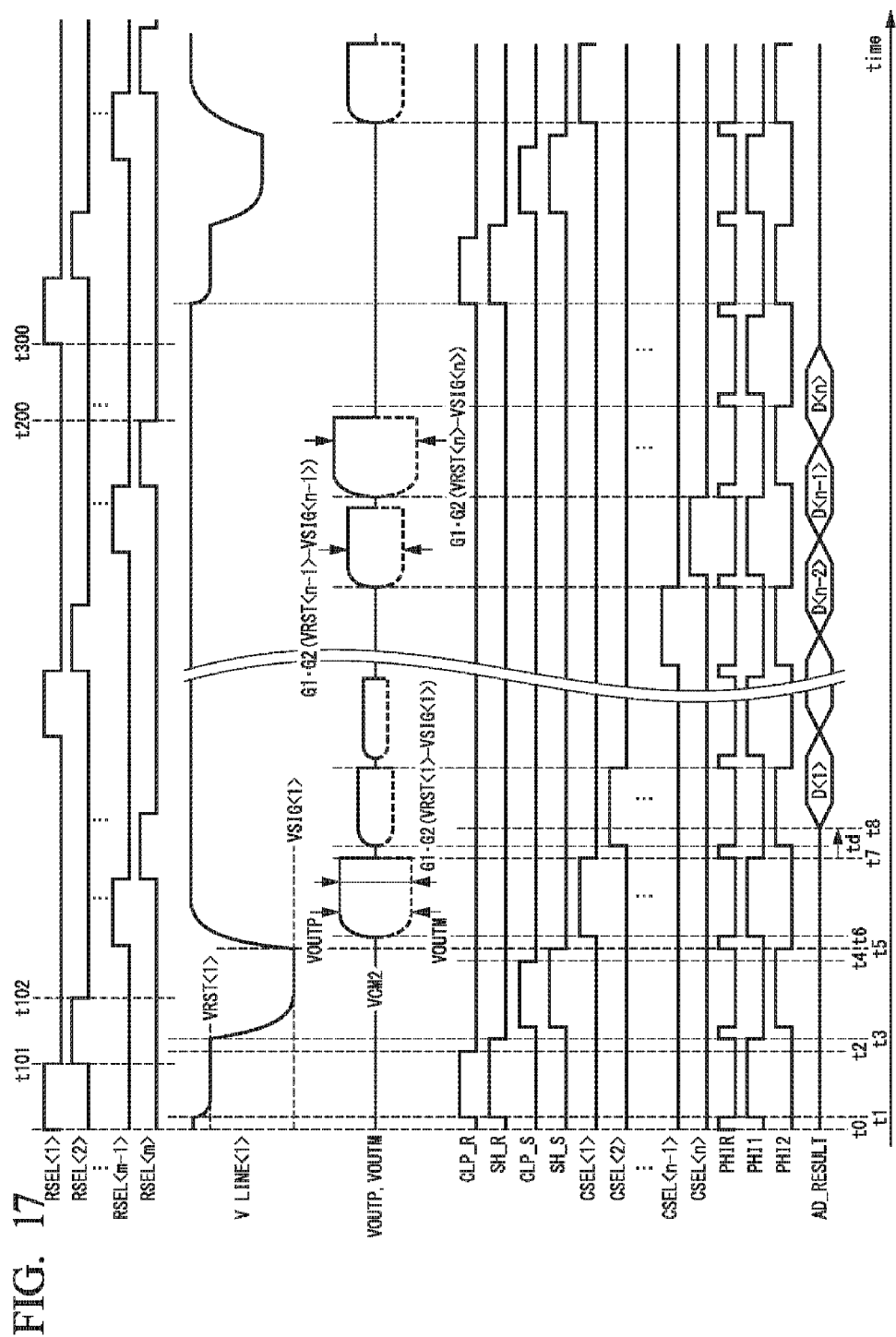
FIG. 17 is a timing chart describing an operation of the semiconductor device according to the fourth embodiment of the present invention.
Figure 19:
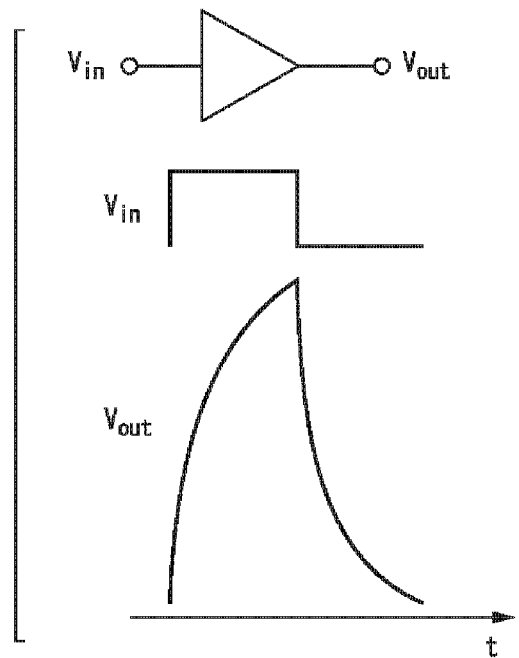
FIG. 19 is a reference diagram showing connection in an amplifier, a waveform of an input signal of the amplifier, and a waveform of an output signal of the amplifier in the related art.
Figure 20:
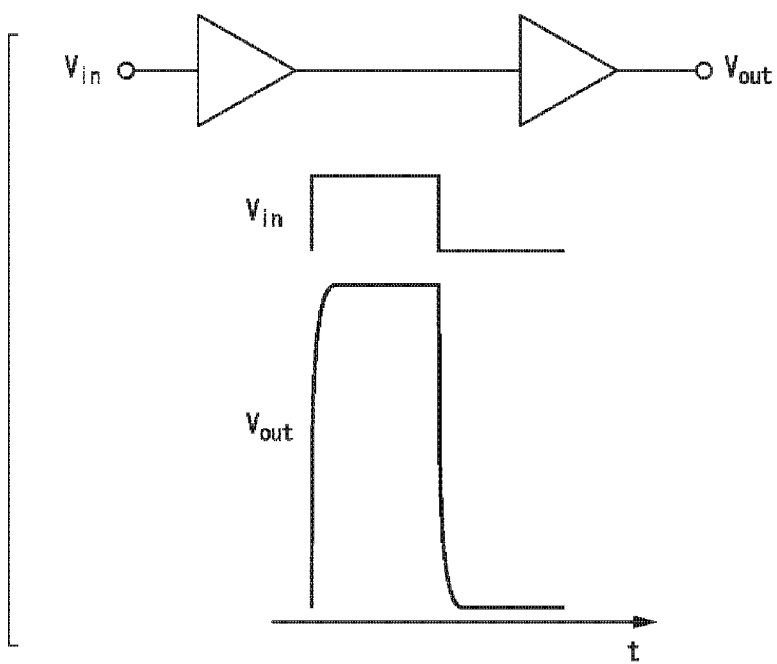
FIG. 20 is a reference diagram showing connection in an amplifier, a waveform of an input signal of the amplifier, and a waveform of an output signal of the amplifier in the related art.

An operation of the semiconductor device APTSc will be described with reference to FIGS. 15 to 17. FIG. 17 shows the operation of the semiconductor device APTSc. FIG. 17 shows waveforms of control signals RSEL<1> to RSEL<m>, a waveform of an analog signal V_LINE<1>, a waveform of a positive output signal VOUTP, a waveform of a negative output signal VOUTM, waveforms of control signals CLP_R, SH_R, CLP_S, SH_S, CSEL<1> to CSEL<n>, PHI1 PHI2, and PHIR, and a state of an AD converted result AD_RESULT. A horizontal direction of FIG. 17 indicates time. A vertical direction of FIG. 17 indicates a voltage. A waveform of the control signal CB is the same as the waveforms of the control signals CSEL<1> to CSEL<n>. In FIG. 17, the waveform of the control signal CB will be omitted.

Before reading shown in FIG. 17 is performed, pixels P[k, l] are reset. Furthermore, after the pixels P[k, l] are reset, the pixels P[k, 1] are exposed at a predetermined time.

Reading of pixels P[1,1] to P[1, n] in an $n^{th}$ column of a first row will be mainly described below. At time t=t0, the control signal PHIR has an H level so that an electric charge is reset in the first variable gain amplifier PGA1c and the second variable gain amplifier PGA2c.

The pixel P[1,1] starts outputting a first signal level VRST<1> at time t=t1. At this timing, the control signal CLP_R and the control signal SH_R have an H level. Thus, the first variable gain amplifier PGA1c starts sampling the first signal level VRST<1> using the first sub-sampling capacitance CS_R. At time t=t2 after a predetermined time elapses and the first signal level VRST<1> is stabilized, the control signal CLP_R has an L level. At this timing, the amount of electric charge held in the first sub-sampling capacitance CS_R (a reset level electric charge) is determined.

At time t=t3 after time t=t2, the control signal SH_R has an L level. Thus, the single-pole single-throw switch SW40 is opened. From time t=t3, the pixel P[1,1] starts outputting a second signal level VSIG<1>. The control signal CLP_S and the control signal SH_S are controlled such that the same operation as the operation of sampling the reset level electric charge is performed. Thus, the first variable gain amplifier PGA1c performs a sampling operation of the second signal level VSIG<1> using the second sub-sampling capacitance CS_S. At time t=t6, the sampling operation of the second signal level VSIG<1> ends. To be specific, the first signal level VRST<1> is a reset output of a pixel. To be specific, the second signal level VSIG<2> is a signal component which is proportional to the amount of exposure of the pixel. The column circuit COL<2> to COL<n> performs sampling according to output signals of pixels P[1,2] to P[1, n] of the first row in synchronization with time t1 to t5 described above.

The control signal SH_R is common to the plurality of column circuits COL<1> to COL<n> corresponding to columns of the plurality of pixels P[k,l]. For this reason, the plurality of first sub-sampling capacitances CS_R simultaneously hold the first signal levels VRST<1> to VRST<n> of the plurality of columns in a period in which the control signal SH_R has an H level.

The control signal SH_S is common to the plurality of column circuits COL<1> to COL<n> corresponding to the columns of the plurality of pixels P[k, l]. For this reason, the plurality of second sub-sampling capacitances CS_S simultaneously hold the second signal levels VSIG<1> to VSIG<n> of the plurality of columns in a period in which the control signal SH_S has an H level.

At time t=t6 to time t=t7, the control signal CSEL<1> and the control signal CB become H levels in synchronization with the control signal PHI1. During this time, the first sub-sampling capacitance CS_R, the second sub-sampling capacitance CS_S, the first feedback capacitance Cf1b, the first feedback capacitance Cf1b', and the first operational amplifier OTA1 constitute a switched capacitor integrator. The first variable gain amplifier PGA1c obtains a value which is G1=Cs1/Cf1 times a voltage serving as a difference between the first signal level VRST<1> and the second signal level VSIG<1>. The first variable gain amplifier PGA1c outputs a differential signal having the second common mode voltage VCM2 as a common mode level. When the gain G of the semiconductor device APTSc is 1 or less like in the first embodiment, the differential signal is output to the AD converter ADCc. When the gain G of the semiconductor device APTSc is higher than 1, the differential signal is output to the AD converter ADCc via the second variable gain amplifier PGA2c.

The AD converter ADCc continues to sample a differential signal from the first variable gain amplifier PGA1c or the second variable gain amplifier PGA2c in the load capacitance CLb and the load capacitance CLb' in a period in which the control signal PHI1 has an H level. The AD converter ADCc finally holds a voltage when the control signal PHI1 is switched to an L level. The AD converter ADCc starts AD conversion of a differential signal corresponding to an analog signal from the column circuit COL<1> when the control signal PHI1 transitions to an L level at time t=t7. A level of the differential signal is G1·G2 (VRST<1>V−SIG<1>). At time t=t8 after a predetermined time td has elapsed, the AD converter ADCc updates the converted result AD_RESULT and outputs the converted result AD_RESULT (D<1>).

Hereinafter, similarly, the control signals CSEL<2> to CSEL<n> are sequentially selected so that analog signals are read from pixels of a second column to an $n^{th}$ column. Each of the read analog signals is input to the first variable gain amplifier PGA1c via the column circuits COL<2> to COL<n>. The analog signal is amplified by only the first variable gain amplifier PGA1c or by the first variable gain amplifier PGA1c and the second variable gain amplifier PGA2c. The first variable gain amplifier PGA1c sequentially outputs differences between first signal levels VRST<1> to VRST<n> of a plurality of columns and second signal levels VSIG<1> to VSIG<n> thereof in a period in which the control signals CSEL<1> to CSEL<n> sequentially become H levels.

Signals which are amplified by only the first variable gain amplifier PGA1c or by the first variable gain amplifier PGA1c and the second variable gain amplifier PGA2c are sequentially input to the AD converter ADCc. The AD converter ADCc performs AD conversion on signals corresponding to analog signals from pixels of an odd column at a timing at which the control signal PHI1 has an L level. The AD converter ADCc performs AD conversion on signals corresponding to analog signals from pixels of an even column at a timing at which the control signal PHI2 has an L level. The AD converter ADCc sequentially updates the converted results AD_RESULT and sequentially outputs the converted results AD_RESULT (D<2> to D<n>).

At time t101 after reading of pixels P[1, n] of a first row and an $n^{th}$ column has been completed, a control signal RSEL<1> transitions from an H level to an L level. Simultaneously, a control signal RSEL<2> transitions from an L level to an H level. After this timing, analog signals from a pixel P[2,1] of a second row and a first column to pixels P[2, n] of a second row and an $n^{th}$ column are read via the column circuits COL<1> to COL<n>. Hereinafter, similarly, signals from pixels of a third row to an $m^{th}$ row are read. At time t=t200, reading ends. After the reading ends and exposure of each pixel has been completed, at time t=t300, the control signal RSEL<1> transitions from an L level to an H level again. Thus, reading of the pixels P[1,1] to P[1, n] of the first row is started.

An operation of the semiconductor device APTSc will be described in greater detail using FIGS. 18 and 21. The gain G1 of the first variable gain amplifier PGA1c and the gain G2 of the second variable gain amplifier PGA2c are controlled by the control circuit CTRLc so that G1=Cs1/Cf1 and G2=Cs2/Cf2 are satisfied. This point is the same as the first to third embodiments. Furthermore, in the fourth embodiment, there is a condition in which a capacitance value Cs2 is inversely proportional to the gain G1=Cs1/Cf1 of the first variable gain amplifier PGA1c. For example, Cf1=Cs2=Cf2 is established. This point is different from those of the first to third embodiments. This point will be mainly described below. Cf1 corresponds to capacitance values of the first feedback capacitances Cf1a, Cf1b, Cf1a', and Cf1b'. Cs2 corresponds to capacitance values of the second sampling capacitances Cs2a, Cs2a', Cs2b, and Cs2b'. Cf2 corresponds to capacitance values of the second feedback capacitances Cf2a, Cf2b, Cf2a', and Cf2b'. A case in which Cf1=Cs2=Cf2 is satisfied will be described below.

FIG. 18 shows an effective load capacity $C_{Leff}$ to be driven by a variable gain amplifier mounted in the semiconductor device APTSc and an effective load capacity $C_{Leff\_PA}$ to be driven by a variable gain amplifier in the related art. In FIG. 18, $C_{Leff1}$ indicates an effective load capacity of the first variable gain amplifier PGA1c. $C_{Leff2}$ indicates an effective load capacity of the second variable gain amplifier PGA2c. $C_{Leff}$ indicates a sum of the effective load capacities of the first variable gain amplifier PGA1c and the second variable gain amplifier PGA2c. $C_{Leff\_PA}$ indicates an effective load capacity of the variable gain amplifier in the related art.

Figure 21:
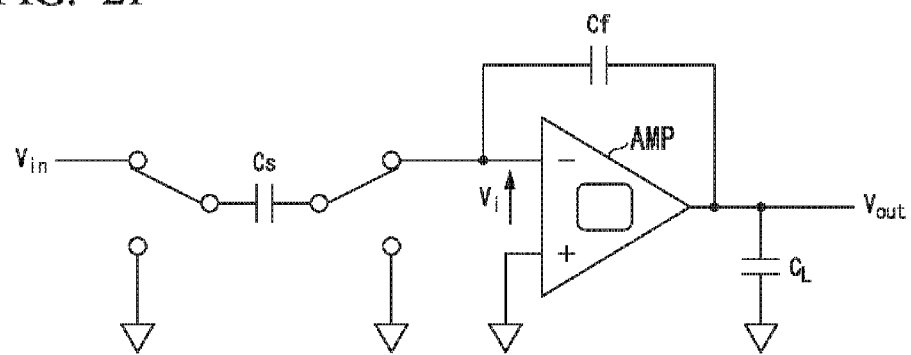
FIG. 21 is a reference diagram showing a load capacity model of a variable gain amplifier in the related art.

The variable gain amplifier in the related art is a switched capacitor type integrating amplifier shown in FIG. 21. FIG. 21 shows a load capacity model of the variable gain amplifier in the related art. The model shown in FIG. 21 includes a sampling capacitance Cs, a feedback capacitance Cf, and a variable gain amplifier AMP.

An effective load capacity $C_{Leff\_PA}$ of the variable gain amplifier AMP in the related art will be described using FIG. 21. The effective load capacity $C_{Leff\_PA}$ of the variable gain amplifier AMP in the related art is obtained by Expression (9).

[Math. 1]

$$C_{Leff\_PA} = C_L + C_S + \frac{C_L \cdot C_S}{C_f} = C_L + C_S + G_{PA} \cdot C_L \quad (9)$$

In Expression (9), $G_{PA}=C_s/C_f$ is a gain of a switched capacitor type integrator. In Expression (9), in a third item between the two equal characters, the load capacitance $C_L$ is a value which is the gain times ($G_{PA}$ times) the variable gain amplifier AMP. In other words, when a gain of the variable gain amplifier AMP is high, the effective load capacity $C_{Leff\_PA}$ becomes very large.

On the other hand, the first variable gain amplifier PGA1c and the second variable gain amplifier PGA2c are controlled so that conditions of Cf1=Cs2=Cf2 are satisfied due to an operation of the control circuit CTRLc. Therefore, the effective load capacity $C_{Leff1}$ of the first variable gain amplifier PGA1c is obtained by Expression (10). As represented by Expression (10), a value of the effective load capacity $C_{Leff1}$ of the first variable gain amplifier PGA1c is constant even when the gain of the first variable gain amplifier PGA1c is high.

[Math. 2]

$$\begin{aligned} C_{Leff1} &= Cs2 + Cs1 + \frac{Cs2 \cdot Cs1}{Cf1} \\ &= Cf1 + Cs1 + \frac{Cf1 \cdot Cs1}{Cf1} \\ &= Cf1 + 2 \cdot Cs1 \end{aligned} \quad (10)$$

An effect of the fourth embodiment will be more specifically verified. For this reason, effective load capacities of the variable gain amplifier in the fourth embodiment and the variable gain amplifier AMP in the related art are compared under the condition in which a capacitance value Cs=275 fF using FIG. 18.

As shown in FIG. 18, when the gain G is 2 or less, an effective load capacity $C_{Leff}$ and an effective load capacity $C_{Leff\_PA}$ are substantially the same. When the gain G is 4 or more, the effective load capacity $C_{Leff}$ of the variable gain amplifier in the fourth embodiment is much smaller than the effective load capacity $C_{Leff\_PA}$ of the variable gain amplifier AMP in the related art.

A settling time constant τ of a general variable gain amplifier is obtained by τ=gm/(2πC). gm is a transconductance of the variable gain amplifier. C is an effective load capacity of the general variable gain amplifier. A condition in which a time constant (τ1+τ2) of the variable gain amplifier in the fourth embodiment is the same as a settling time constant $\tau_{CONV}$ of the variable gain amplifier in the related art is obtained by Expression (11).

$$g_{m1}/(2\pi C_{eff1}) + g_{m2}/(2\pi C_{eff2}) = g_{m\_PA}/(2\pi C_{eff\_PA}) \qquad (11)$$

In Expression (11), τ1 is a time constant of the first variable gain amplifier PGA1c. τ2 is a time constant of the second variable gain amplifier PGA2c. $\tau_{CONV}$ is a time constant of the variable gain amplifier AMP in the related art. $g_{m1}$ is a transconductance of the first variable gain amplifier PGA1c. $g_{m2}$ is a transconductance of the second variable gain amplifier PGA2c. $g_{m\_PA}$ is a transconductance of the variable gain amplifier AMP in the related art.

If effective load capacities when the gain G is 8, which are shown in FIG. 18, are substituted into Expression (11), Expression (12) is established.

$$g_{m1}/0.584 + g_{m2}/1.034 = g_{m\_PA}/4.775 \qquad (12)$$

For example, when $g_{m1}$=0.584[S], $g_{m2}$=1.034[S], and $g_{m\_PA}$=4.775×2=9.55[S], settling time constants of two variable gain amplifiers to be compared are equal. In other words, the variable gain amplifier in the fourth embodiment can achieve the same settling characteristics as the variable gain amplifier AMP in the related art with a smaller transconductance. It is generally known that a transconductance of a transconductance amplifier is proportional to current consumption to the power of 1 or 0.5. The variable gain amplifier in the fourth embodiment can achieve a predetermined settling characteristic with a smaller transconductance than that in the related art. For this reason, the variable gain amplifier in the fourth embodiment can reduce current consumption compared to the variable gain amplifier AMP in the related art.

(Seventh Advantage)

The semiconductor device APTSc is controlled such that capacitance values Cs2 of the second sampling capacitances Cs2a, Cs2b, Cs2a', and Cs2b' of the second variable gain amplifier PGA2c are inversely proportional to the gain G1 of the first variable gain amplifier PGA1c. For this reason, an effective load capacity of the first variable gain amplifier PGA1c is substantially constant even when the gain G of the semiconductor device APTSc is high. Since current consumption of the variable gain amplifier is proportional to a load capacitance, the variable gain amplifier in the fourth embodiment can perform amplification with a high gain without increasing current consumption of a circuit.

(Eighth Advantage)

In the semiconductor device APTSc, the first variable gain amplifier PGA1c, the second variable gain amplifier PGA2c, the selection switches SEL1a and SEL2a, and the sampling capacitance of the AD converter ADCc are arranged in the same substance. For this reason, a parasitic capacitance generated due to a signal wire, a bonding wire, or the like can be minimized. As a result, load capacitances of the first variable gain amplifier PGA1c and the second variable gain amplifier PGA2c can be reduced. Therefore, a further decrease in power consumption can be achieved.

(Modified Example)

Common mode input voltages (VCM) of the first variable gain amplifiers PGA1a, PGA1b, and PGA1c and the second variable gain amplifiers PGA2a and PGA2c mounted in the semiconductor devices APTSa, APTSb, and APTSc may be larger than a common mode output voltage (VCM2). In this case, power consumption is not reduced in the AD converters ADC and ADCc, but input ranges of the AD converter ADC and ADCc are increased. Therefore, there is a possibility that power consumption is able to be decreased in all of the semiconductor devices APTSa, APTSb, and APTSc which need to handle signals with large amplitudes.

For ease of explanation, a description is provided under operation conditions in which capacitance values Cs2 of the second sampling capacitances Cs2a, Cs2b, Cs2a', and Cs2b' are set to be inversely proportional to the gain G1 of the first variable gain amplifier PGA1c by the control circuit CTRLc in only the fourth embodiment. Such operation conditions can also be applied to the first to third embodiments, and the same advantages can be obtained.

In the fourth embodiment, the gain G2 of the second variable gain amplifier PGA2c is fixed at 1. The gain G2 of the second variable gain amplifier PGA2c may be larger than 1 in accordance with design conditions in a range in which the capacitance values Cs2 of the second sampling capacitances Cs2a, Cs2b, Cs2a', and Cs2b' are inversely proportional to the gain G1 of the first variable gain amplifier PGA1c. Under the condition close to the sampling capacitance described in the fourth embodiment, current consumption is a minimum under the condition in which a value of the gain G2 of the second variable gain amplifier PGA2c is about 1.2 to 2.

An example in which all of the blocks constituting the semiconductor device APTSc are formed in the same semiconductor substrate in only the fourth embodiment has been described. This can also be applied to the first to third embodiments, and the same advantages can be obtained.

While preferred embodiments of the invention have been described and shown above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A semiconductor device, comprising:
   a first variable gain amplifier;
   a second variable gain amplifier;
   a load circuit including a capacitive load; and
   a selection switch,
   wherein the first variable gain amplifier includes a first sampling capacitance configured to hold a first voltage signal which is input, a first feedback capacitance, and a first operational amplifier, the first operational amplifier including a first input terminal and a first output terminal, the first input terminal being connected to the first sampling capacitance, and the first feedback capacitance being connected between the first input terminal and the first output terminal,
   an amplification factor of the first variable gain amplifier is determined by a ratio between a capacitance value of the first sampling capacitance and a capacitance value of the first feedback capacitance,
   the second variable gain amplifier includes a second sampling capacitance configured to sample a second voltage signal which is output from the first variable gain amplifier, a second feedback capacitance, and a second operational amplifier, the second operational amplifier including a second input terminal and a second output terminal, the second input terminal being connected to the second sampling capacitance, and the second feedback capacitance being connected between the second input terminal and the second output terminal, an amplification factor of the second variable gain amplifier is determined by a ratio between a capacitance value of the second sampling capacitance and a capacitance value of the second feedback capacitance, the first variable gain amplifier and the second variable gain amplifier constitute a switched capacitor type variable gain amplifier, and the selection switch switches connection among the first variable gain amplifier, the second variable gain amplifier, and the load circuit such that the first variable gain amplifier and the load circuit are connected to each other when the amplification factor of the first variable gain amplifier is a predetermined gain or less, and the second variable gain amplifier is connected between the first variable gain amplifier and the load circuit when the amplification factor of the first variable gain amplifier is larger than the predetermined gain.

2. The semiconductor device according to claim 1, further comprising:

a control circuit configured to halt the second variable gain amplifier when the amplification factor of the first variable gain amplifier is the predetermined gain or less.

3. The semiconductor device according to claim 1, wherein the second variable gain amplifier is controlled so that sampling and amplifying of the second voltage signal are simultaneously performed.

4. The semiconductor device according to claim 3, wherein the first variable gain amplifier and the second variable gain amplifier are fully differential amplifiers, the first output terminal includes a first positive output terminal and a first negative output terminal, the second input terminal includes a second positive input terminal and a second negative input terminal, the second output terminal includes a second positive output terminal and a second negative output terminal, when the amplification factor of the first variable gain amplifier is the predetermined gain or less, a signal which is output from the first positive output terminal is output as a positive output signal, and a signal which is output from the first negative output terminal is output as a negative output signal, when the amplification factor of the first variable gain amplifier is larger than the predetermined gain, the first positive output terminal and the second positive input terminal are electrically connected to each other, and the first negative output terminal and the second negative input terminal are electrically connected to each other, and when the amplification factor of the first variable gain amplifier is larger than the predetermined gain, a signal which is output from the second positive output terminal is output as the positive output signal, and a signal which is output from the second negative output terminal is output as the negative output signal.

5. The semiconductor device according to claim 1, wherein the first variable gain amplifier and the second variable gain amplifier are fully differential amplifiers, a common mode output voltage of the first operational amplifier is smaller than a common mode input voltage of the first operational amplifier, and a common mode output voltage of the second operational amplifier is smaller than a common mode input voltage of the second operational amplifier.

6. The semiconductor device according to claim 1, wherein the first sampling capacitance includes a first sub-sampling capacitance and a second sub-sampling capacitance, the first sub-sampling capacitance holds a first signal level of the first voltage signal in a first period, the second sub-sampling capacitance holds a second signal level of the first voltage signal in a second period which is different from the first period, and the second signal level is different from the first signal level, and the first variable gain amplifier outputs a difference between the first signal level and the second signal level in a third period which is different from the first period and the second period.

7. The semiconductor device according to claim 6, further comprising:

a pixel array in which a plurality of pixels configured to generate the first voltage signal in accordance with incident light are arranged in a matrix form, wherein a plurality of the first sampling capacitances corresponding to a plurality of columns of the pixel array are arranged, a plurality of the first sub-sampling capacitances simultaneously hold the first signal levels of the plurality of columns in the first period, a plurality of the second sub-sampling capacitances simultaneously hold the second signal levels of the plurality of columns in the second period, and the first variable gain amplifier sequentially outputs differences between the first signal levels and the second signal levels of the plurality of columns in the third period.

8. The semiconductor device according to claim 1, wherein the capacitance value of the second sampling capacitance is set to be inversely proportional to a gain of the first variable gain amplifier.

9. The semiconductor device according to claim 1, wherein the load circuit is an analog to digital (AD) converter including a sampling capacitance, and the first variable gain amplifier, the second variable gain amplifier, the selection switch, and the load circuit are arranged in the same substrate.

* * * * *